United States Patent
Franaszek et al.

(10) Patent No.: US 6,215,412 B1
(45) Date of Patent: Apr. 10, 2001

(54) ALL-NODE SWITCH-AN UNCLOCKED, UNBUFFERED, ASYNCHRONOUS SWITCHING APPARATUS

(75) Inventors: Peter Anthony Franaszek, Yorktown Heights; Christos John Georgiou, White Plains; Robert Francis Lusch, Vestal, all of NY (US); Joseph Michael Mosley, Boca Raton, FL (US); Howard Thomas Olnowich, Endwell, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/457,789

(22) Filed: Jun. 2, 1995

Related U.S. Application Data

(63) Continuation of application No. 08/143,977, filed on Oct. 27, 1993, now abandoned, which is a continuation of application No. 07/677,543, filed on Mar. 29, 1991, now abandoned.

(51) Int. Cl.[7] .................................................. H04Q 1/00
(52) U.S. Cl. ........................ 340/825.02; 370/299; 370/357
(58) Field of Search ........................ 340/825.02, 825.79, 340/825.3, 825.89, 826, 825.5; 370/91, 93, 299, 357

(56) References Cited

U.S. PATENT DOCUMENTS

| | | | |
|---|---|---|---|
| 3,246,298 | 4/1966 | Schramel et al. | 340/172.5 |
| 3,268,866 | 8/1966 | Van't Slot et al. | 340/147 |
| 3,916,380 | 10/1975 | Fletcher et al. . | |
| 4,237,447 | 12/1980 | Clark | 340/147 |
| 4,251,879 | 2/1981 | Clark | 370/60 |
| 4,307,378 | 12/1981 | Clark | 340/825.01 |
| 4,307,446 | 12/1981 | Barton et al. | 364/200 |
| 4,314,233 | 2/1982 | Clark | 340/825.02 |

(List continued on next page.)

FOREIGN PATENT DOCUMENTS

| | | |
|---|---|---|
| 0208319 | 1/1987 | (EP) . |
| 8504776 | 10/1985 | (WO) . |
| 8700373 | 1/1987 | (WO) . |

OTHER PUBLICATIONS

IBM TDB vol. 33, No. 5, Oct., 1990, "Asynchronous Digital Video Switching System", by Farrell et al, pp. 227–233.

IBM TDB vol. 30, No. 1, Jun. 1987 p. 72–78, Pol Actuated Multiple Access Technique for Broadgathering Systems, Calo et al.

(List continued on next page.)

*Primary Examiner*—Brian Zimmerman
(74) *Attorney, Agent, or Firm*—Lawrence R. Fraley

(57) ABSTRACT

A new asynchronous approach used to quickly and dynamically switch input port connections to output port connections and to resolve contention. The switch is self-routing in two cycle times at the same high speed serial rate that data is transferred through the switch. The normal mode of the switch requires absolutely no synchronization amongst any of the input and output ports which interface to the switch. The switch is void of centrally controlled clocking and any data buffering. Data traverses the switch only encountering three gate delays—on-chip receiver, mux, and off-chip driver. Contention is detected and resolved on chip, and yet the logic implementation is extremely simple and low in gate count, so the switch design is never gate limited. The protocol requires several parallel data lines plus two or three control lines.

11 Claims, 21 Drawing Sheets

U.S. PATENT DOCUMENTS

| | | | |
|---|---|---|---|
| 4,475,188 | 10/1984 | Wilson et al. | 370/60 |
| 4,481,623 | 11/1984 | Clark | 370/60 |
| 4,482,996 | 11/1984 | Wilson et al. | 370/60 |
| 4,484,325 | 11/1984 | Wilson et al. | 370/60 |
| 4,518,960 | 5/1985 | Clark | 340/825.02 |
| 4,623,996 | 11/1986 | McMillen | 370/60 |
| 4,701,906 | 10/1987 | Ransom et al. | 370/60 |
| 4,706,080 | 11/1987 | Sincoskie | 340/825.02 |
| 4,752,777 * | 6/1988 | Franaszek | 340/825.79 |
| 4,754,395 | 6/1988 | Weisshaar et al. | 364/200 |
| 4,766,592 | 8/1988 | Baral et al. | 370/62 |
| 4,815,105 | 3/1989 | Bottoms et al. | 375/37 |
| 4,817,082 * | 3/1989 | Orsic | 340/825.79 |
| 4,818,984 | 4/1989 | Chang et al. | 340/825.54 |
| 4,835,674 | 5/1989 | Collins et al. | 364/200 |
| 4,855,899 | 8/1989 | Presant | 364/200 |
| 4,897,834 | 1/1990 | Peterson et al. | 370/85.1 |
| 4,926,375 | 5/1990 | Mercer et al. | 364/900 |
| 4,935,866 | 6/1990 | Sauvajol et al. | 364/200 |
| 4,941,084 | 7/1990 | Terada et al. | 364/200 |
| 4,952,930 | 8/1990 | Franaszek et al. | 340/825.8 |
| 4,956,772 | 9/1990 | Neches | 364/200 |
| 4,965,788 | 10/1990 | Newman | 370/94.1 |

OTHER PUBLICATIONS

IBM TDB vol. 22, No. 12, May 1980 p. 5450–52, Distributed Star Network with unrooted Tree topology, Close et al.

IEEE Trans. Computers C–32, 175–189 (Feb. 1983), NYU Ultracomputer Gottlieb et al.

IBM Research Parallel Processor Prototype "Proceedings of 1985 International Conference on Parallel Processing", pp. 764–769 Pfister et al.

* cited by examiner

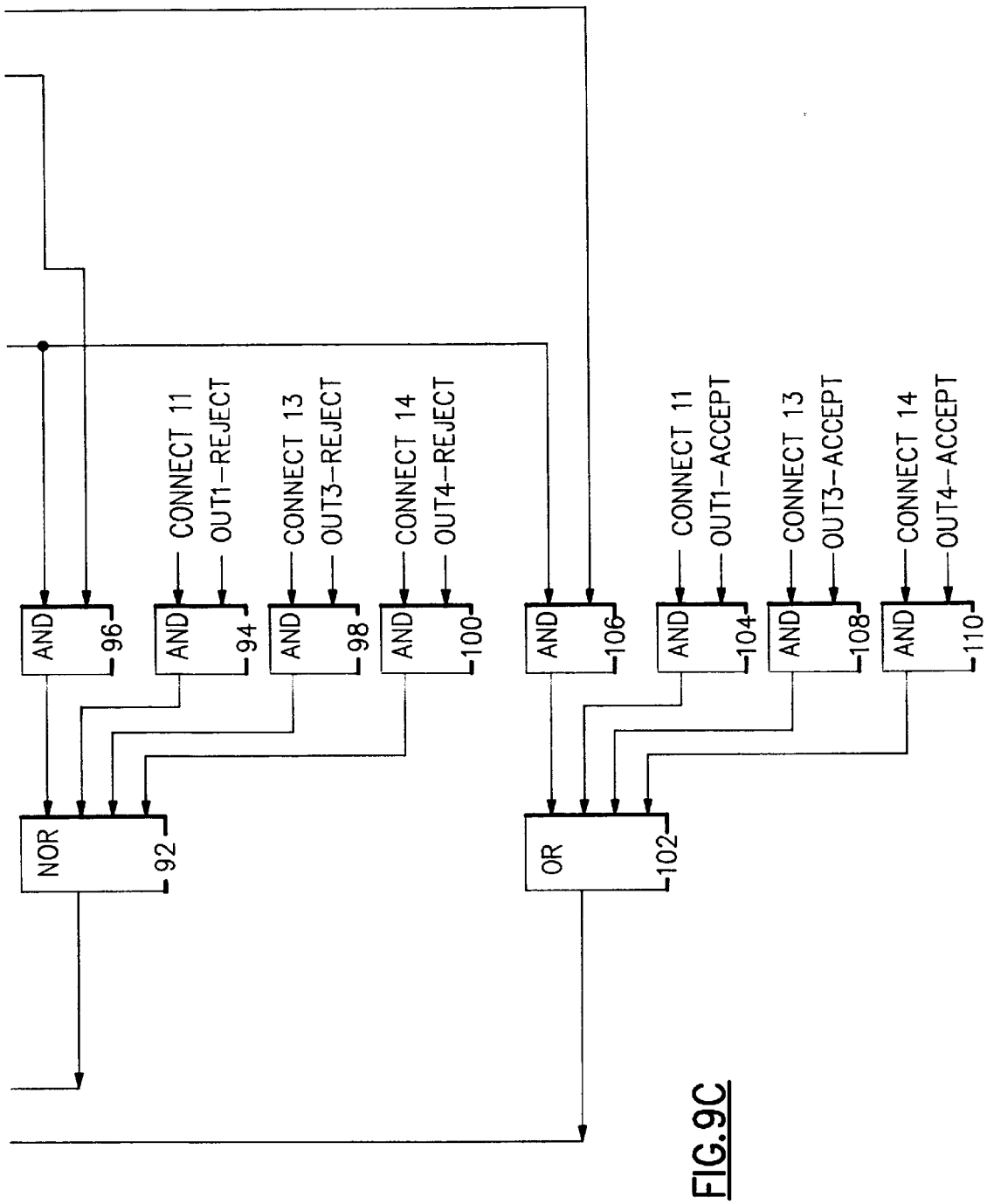
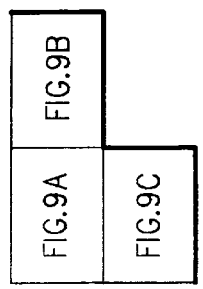

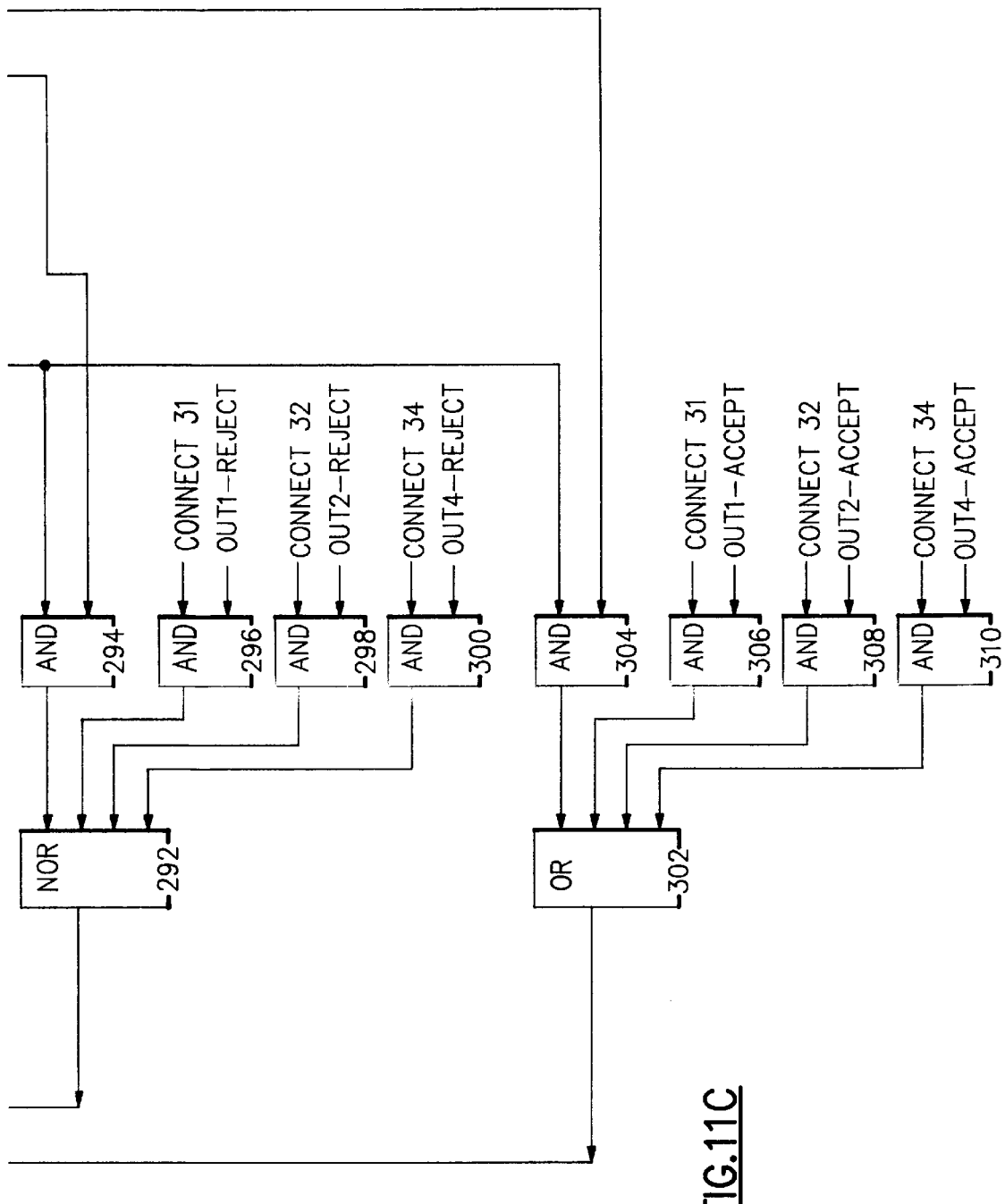
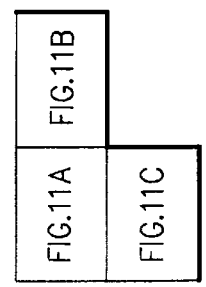
FIG.11C
FIG.11

ALL-NODE SWITCH-AN UNCLOCKED, UNBUFFERED, ASYNCHRONOUS SWITCHING APPARATUS

The application is a continuation, of application Ser. No. 08/143,977, filed Oct. 27, 1993 abandoned. which is a continuation, of application Ser. No. 07/677,543 filed Mar. 29, 1991 abandoned.

FIELD OF THE INVENTION

The present invention relates to digital computer systems comprised of several or many computing and/or input/output elements, and the ability of the said individual elements to perform high speed, low-latency communications with each other in a parallel fashion over switching networks.

BACKGROUND OF THE INVENTIONS

Multi-stage switching networks are gaining acceptance as a means for interconnecting multiple devices within modern digital computing systems. In particular, in Parallel Processing (PP) Systems, it is common to use a multi-staged switching network to interconnect N system elements, where N can be several or thousands of processors or combinations of processors and other system elements.

The state-of-the-art switch approaches have many short comings which prevent them from being ideal for PP systems. They tend to be expensive, slow, non-expandable, hard to reconfigure, serial in nature, and, worst of all, have clocking problems. The clocking problems are ever increasing as digital computing systems continue to operate at higher and higher frequencies (usually doubling every several years). This is further complicated by increased system size and distance between system elements, especially in the field of PP systems. This presents an enormous clocking problem of how to keep various elements of the system synchronized for communication purposes. Several state-of-the-art methods have been employed somewhat successfully, but not without being cumbersome, risky, and leaving one wondering if they will work for the next increase in clock frequency or system size.

The state-of-the-art clocking methods include:

a) Distributing a central clock and carefully controlling the delay time to each individual element (processor, I/O device, and switch), so that a synchronized and aligned clock, tuned to within a small tolerance, arrives at each element. In addition, to enable various system elements to communicate without losing synchronization, it is necessary for all communication links to have a transfer time from one element to another which is less than one cycle time of the common clock.

b) Using the same central, synchronized clocking scheme as a), but further allowing the flexibility in the communication time between elements by permitting transfer times to be longer than one clock cycle time. Transfer time is allowed to be any multiple of the common clock cycle time and every connecting wire between elements is hand tuned by individually trimming each wire, so that it produces a delay which is a multiple of the common clock cycle within a specified tolerance.

c) Distributing a central clock and not controlling the delay time to each individual element; however, providing exactly the same frequency to each element. With this approach, each interconnecting wire can be of any length and does not have to be hand tuned. Synchronization between elements is established using a calibration method which is performed at fixed intervals of time with the very first calibration being performed each time power is applied to the system. Each communication link is individually calibrated one at a time by sending test messages over the link and varying the phase of the sending clock. After all possible sending clock phases have been tried, the clock that best suits the length of the individual cable is chosen to be used on a permanent basis (until the next recalibration exercise). The calibration of every interconnection wire in the system can be accomplished automatically, but it is cumbersome, time consuming, and possibly subject to drift over time and temperature.

d) Using two separate chips of different speeds; one to establish and control interconnections and the other to actually pass data between any two elements of the PP system. The control chip operates at a slower, more easily synchronized frequency, while the data chip provides the actual connection between elements when commanded to do so by the controller chip. The data chip can provide data transfer at a faster and even asynchronous rate. There are several disadvantages of this approach. The two chip requirement increases the number of interfaces and connections required making the system more expensive and more complex. Secondly, the selection being controlled remotely in a second chip is usually a slow and serial operation which defeats the important concept of performing operations in parallel, which is required in efficient switching network systems. In addition, the concept is difficult to expand beyond the two chips, so to provide interconnection between as few as sixty-four elements, usually serial data transfer is specified to keep the chip pin count to a reasonable size. Finally, the set-up time for establishing a switch connection via the control chip is usually the dominating and slower factor making the dynamic changing of switch connection almost impossible on a rapid basis. These types of switching networks are not applicable to PP systems, but are being used effectively in I/O areas where switch selections occur infrequently and large amounts of data are transferred over a path once it has been established by the control chip.

As an example of prior art attempts, representative patents are U.S. Pat. No. 4,307,446 issued Dec. 22, 1981; U.S. Pat. No. 4,314,233 issued Feb. 2, 1982; U.S. Pat. No. 4,481,623 issued Nov. 6, 1984; U.S. Pat. No. 4,518,960 issued May 21, 1985; U.S. Pat. No. 4,237,447 issued Dec. 2, 1980; U.S. Pat. No. 4,251,879 issued Feb. 17, 1981; and U.S. Pat. No. 4,307,378 issued Dec. 22, 1981. These patents were followed by U.S. Pat. No. 4,484,325, issued Nov. 20, 1984; U.S. Pat. No. 4,482,996 issued Nov. 13, 1984 and U.S. Pat. No. 4,475,188 issued on Oct. 2, 1984. In U.S. Pat. No. 4,475,188 it will be seen that there was suggested an arbitration switch which strips routing bits from a message, and with a priority of first come, first serve, connects multiple input lines to multiple output lines using self routing path selection followed by data in a clockless environment. As such this development is different from the more standard serial, crossbar or crosspoint switches which have been used. However, the patent requires handshaking and has a different arbitration method than we have found useful. It appears that should the device be used in typical situations it would be slower and slower with lQng cables. Its speed is not independent of cable length. This and other differences will appear upon a review of our improvements in which no buffering, queues, wait periods, or discontinuation of message transmittal is involved when resolving contention. As such, these earlier attempts do not provide the necessary switching network capabilities which are required. In this connection also, reference could also be had to U.S. Pat. No. 4,952,930 issued Aug. 28, 1990, and the references cited therein.

Thus, the state-of-the-art solutions do not provide the switching network characteristics required for modern and future PP systems. The characteristics that are required include the ability to dynamically and quickly establish and break element interconnections, to do it cheaply and easily in one chip, to have expandability to many thousands of elements, to permit any length, non-calibrated interconnection wire lengths, to solve the distributed clocking problems and allow future frequency increases, and to permit parallel establishment and data transmittal over N switching paths simultaneously.

SUMMARY OF THE INVENTION

The invention is a switching means for interconnecting multiple processors or other functional elements comprising a digital system on an as commanded basis. The switching means is based on newly developed means which permit connection control and data transfer between elements to occur over a common and small set of point-to-point, interconnecting wires. The said connection control and data transfer occurs in such a manner that the said switching means is devoid of requiring any synchronized clocking signals, whatsoever. In addition, the said switching means implements new means for resolving connection conflicts instantaneously on an asynchronous basis. This permits various asynchronous elements to contend for the services of the switching apparatus, and said contention to be resolved in a consistent, predefined and parallel manner without causing erroneous or interruption of system operation.

The invention apparatus further provides a switching network communication structure that has the characteristic of simplicity of implementation, and does not require data buffering or data interpretation of any kind. It establishes or breaks connections instantaneously and is, therefore, dynamically changeable with a very quick response time. It has the capability of resolving requests to establish connections in a parallel manner, where N connections can be established or broken at the same time (where N=the number of elements of the system which are communicating via the switching apparatus). Thus, the number of connections that can be made or broken simultaneously scales directly with the size of the system. This capability enables the invention apparatus to handle multiple short messages very efficiently. In addition, the new apparatus is devoid of synchronization requirements or wire length restrictions. It also has the ability to track the speed improvements of new technologies and to increase performance as the technology used to implement the invention apparatus improves.

In addition, the basic new apparatus can be cascaded with other identical invention apparatus devices to form interconnection networks among any number of system elements or nodes. Said network would have the characteristics for full parallel interconnection.

These and other improvements are detailed in the following detailed description. For a better understanding of the invention, together with advantages and features, reference should be made to the following description and the below-described drawings.

DETAILED DESCRIPTION OF THE PREFERRED EMBODIMENTS

Figure 1:
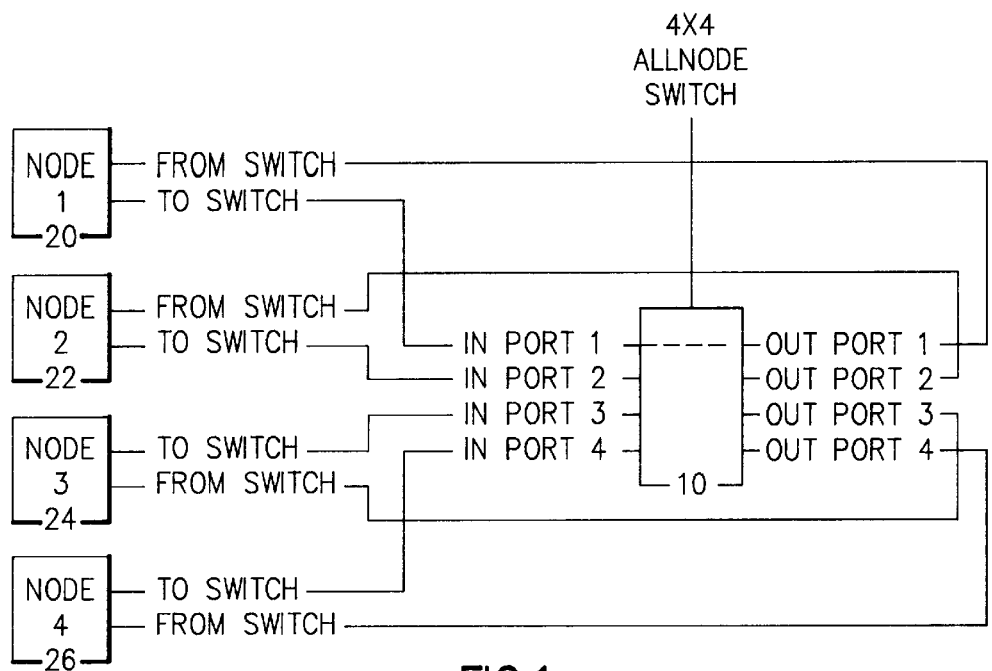
FIG. 1 illustrates generally our preferred embodiment of the present invention as a four-input to four-output (4×4) crossbar switching apparatus.

The preferred embodiment is a 4×4 crossbar switching apparatus, where the function of the present invention is to provide a means of connecting any of four input ports on a mutually exclusive basis to any one of the unused four output ports. Referring to FIG. 1, the 4×4 crossbar switching apparatus can support up to four simultaneous connections at any given time. For instance, Input 1 could be connected to Output 3, Input 2 to Output 4, Input 3 to Output 2, and Input 4 to Output 1.

The invention switching apparatus 10 is unidirectional, which means that data flows in only one direction across the said switching apparatus 10, that being from input to output. Although the said switch apparatus 10 is unidirectional, it supports bidirectional communication amongst four nodes (20, 22, 24, and 26) by connecting the 4×4 ALL-NODE switching apparatus 10 as shown in FIG. 1. Each node 20, 22, 24, and 26 has two sets of unidirectional interconnecting wires, one going to the switch 10 and one coming from the switch 10. The dashed lines internal to the switching apparatus 10 indicate that the function of the said switching apparatus is to connect an input port such as INPUT PORT 1 to one of four possible output ports. The switching apparatus 10 provides exactly the same function for each input port, allowing it to be connected to any unused output port.

Figure 2:
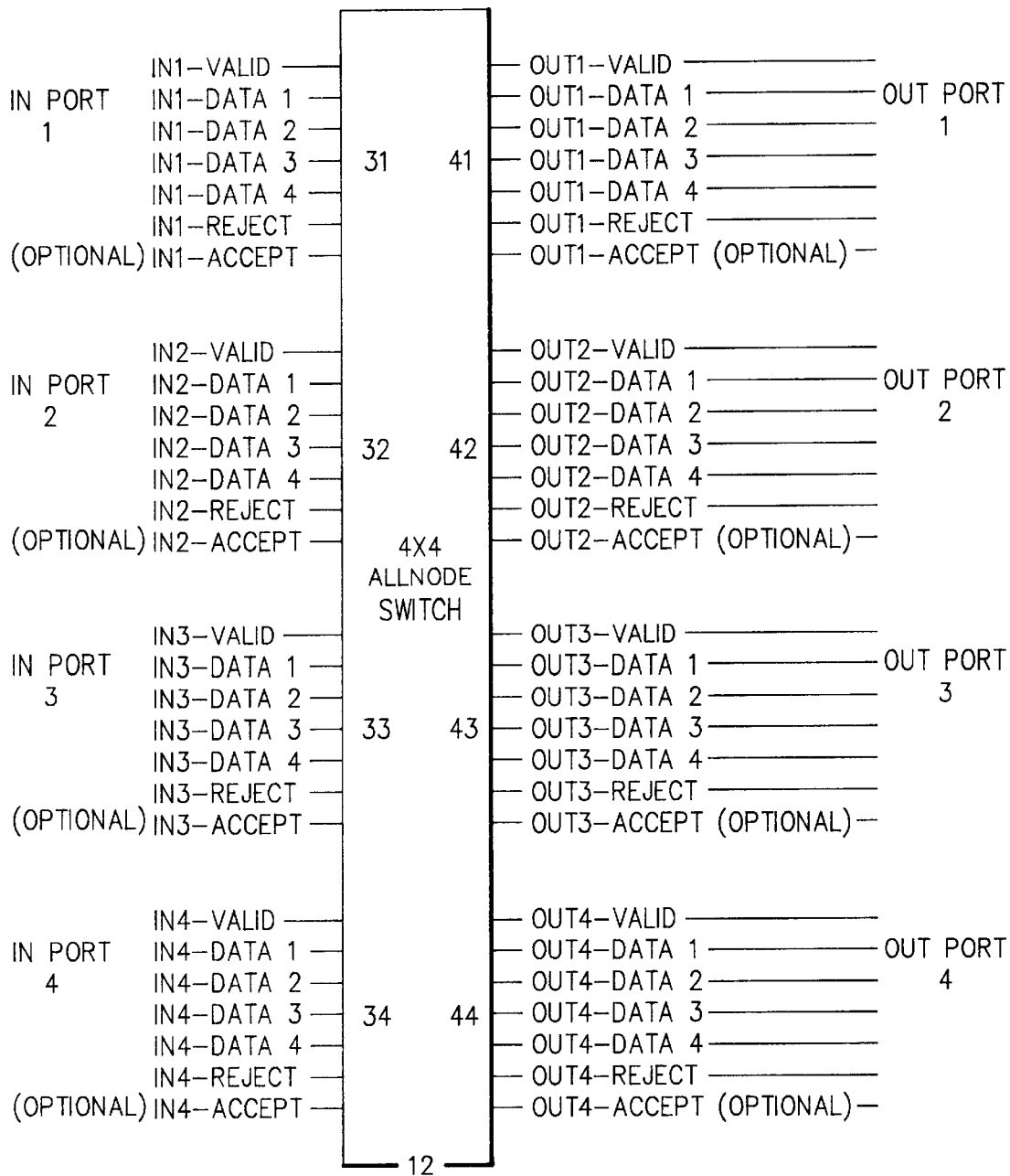
FIG. 2 illustrates a more detailed schematic of the 4×4 crossbar switching apparatus that defines its interface connections.

Referring to FIG. 2, block 12 shows an expanded drawing of switching apparatus 10, and defines in detail the interface lines connecting to switching apparatus 10. The set of lines 31, 32, 33, and 34 at each in-port to the switching apparatus 12 are identical in number and function to the set of lines 41, 42, 43, and 44 at each out-port. The sets of interface lines to each input and output port contain seven unique signals: four data lines and three control lines (VALID, REJECT, and ACCEPT) which are differentiated by a prefix of INX- or OUTX- indicating the direction and number of the port (X) that they are associated with. The four data and one VALID lines have a signal flow in the direction going from input to output across switching apparatus 12, while the REJECT and ACCEPT control lines have a signal flow in the opposite direction.

The sets of input port interface lines 31, 32, 33, and 34 transfer control information to switching apparatus 12 for the purpose of commanding and establishing input port to output port connections internal to the said switching apparatus. In addition, the said port interface lines also carry data information to be transferred from in-port to out-port across the switching apparatus 12. The four data interface lines contained in interfaces 31, 32, 33, and 34 do not restrict the transfer of data across switching apparatus 12 to only four bits of information, but rather the said four data lines can each contain a string of serial data making the transmission of any size data possible. For example, the said four data lines could transfer data at a 160 Mbits/sec rate, if all four data lines were transmitting serial data at a 40 MHZ rate.

Figure 3:
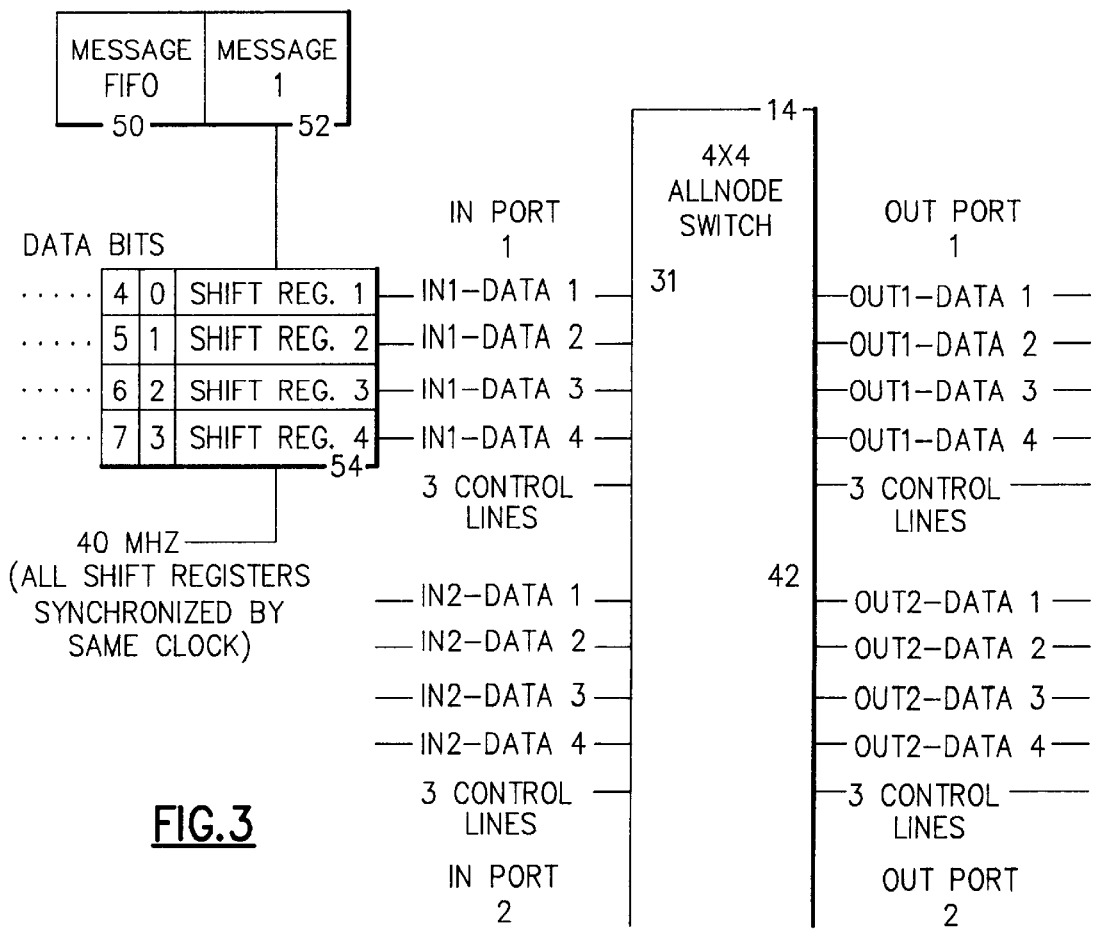
FIG. 3 illustrates a typical method for generating serial control and data information to be sent to the present invention over four synchronous data lines.

The four input ports to switching apparatus 12 each originate at a unique source or node (20, 22, 24, and 26) as shown in FIG. 1. Referring to FIG. 3, blocks 50, 52, and 54 illustrate a typical method for generating serial data in the form of a message which can be transmitted to and across switching apparatus 14, which is a partial drawing of the switching apparatus 12. Similar serial data generation logic as provided by 50, 52, and 54 can be used at each of the other input ports to switching apparatus 12. Each set of input data lines provides serial data to a given input port which is synchronized to the same clock by the four shift registers 54 which create serial data by shifting four synchronized lines of data 31 as controlled by the same identical clocking signal (40 MHZ in FIG.3). However, the four different input port sources (31, 32, 33, and 34) to switching apparatus 14 can be asynchronous to each other, being based on different, non-synchronized, 40 MHZ clocking signals.

The process for sending serial messages through switching apparatus 14 involves FIFO 50, which accumulates data messages to be transmitted. The next entire message to be transmitted is moved to buffer 52. The message stored in buffer 52 is moved to shift registers 54 in preparation for transmittal and the data is dispersed across the four shift registers 54 by placing data bit 0 into the first bit of shift register 1, data bit 1 into the first bit of shift register 2, data bit 2 into the first bit of shift register 3, data bit 3 into the first bit of shift register 4, data bit 4 into the second bit of shift register 1, etc. Shift registers 54 then begin to send serial data to switching apparatus 14 over four synchronized data lines, in such a manner that the serial data flows continuously until the entire message has been transmitted. The switch apparatus 14 uses the first eight bits transmitted (in the first two clock cycles of serial data over interface 31 from serial registers 54 to switching apparatus 14) to select and establish a connection path through the switching apparatus 14. The example in FIG. 3 illustrates via dashed lines, the switching apparatus establishing a temporary connection between input port 1 (31) and output port 2 (42), such that each of the seven individual lines in interface 31 are uniquely and directly connected to each of the corresponding lines in interface 42.

Figure 4:
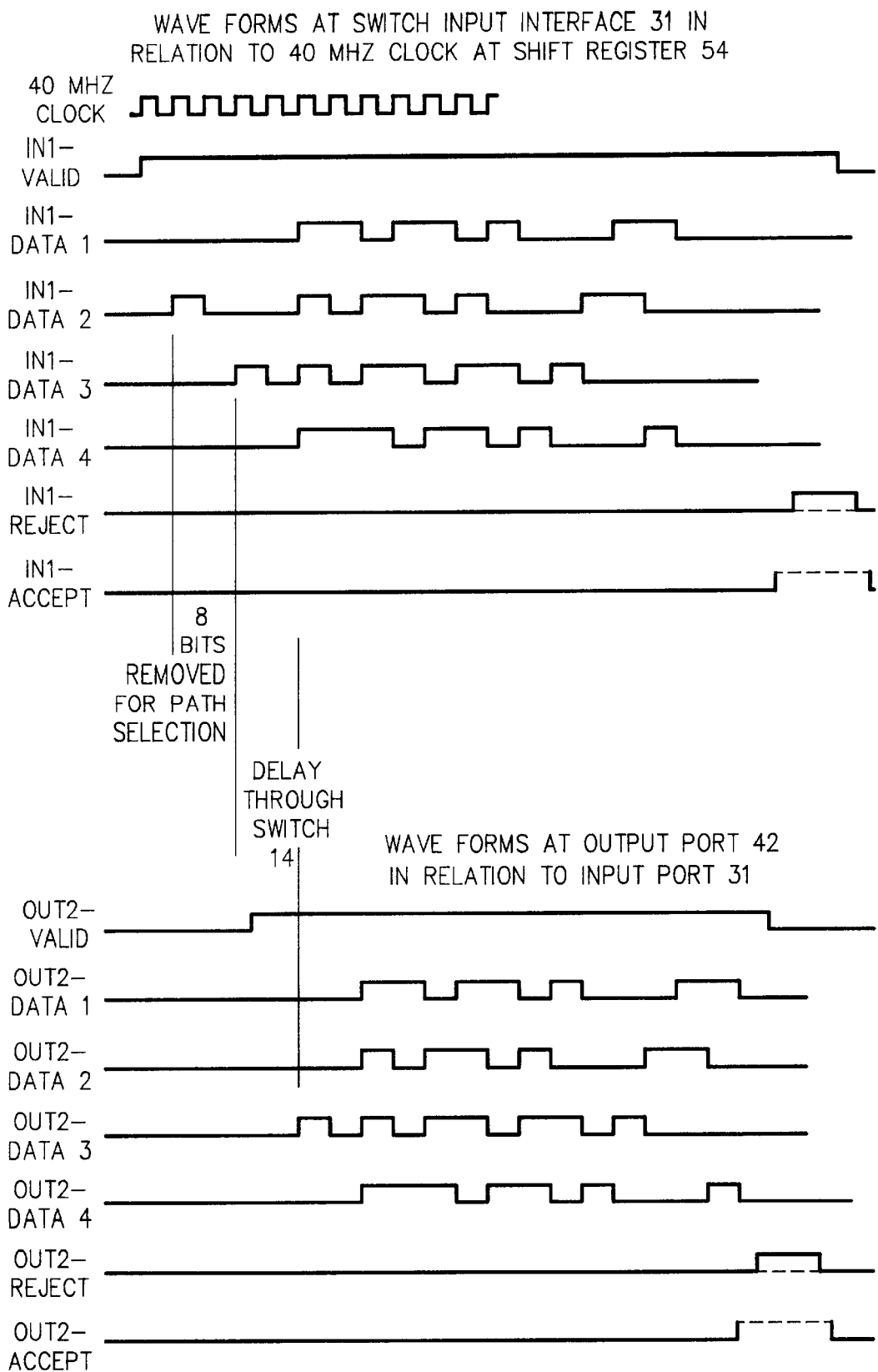
FIG. 4 shows a typical timing diagram for the interface signals arriving at one input port of the invention switching apparatus.

Referring to FIG. 4, typical serial waveforms are shown for both input and output ports of the switching apparatus 14. The switch removes the first eight bits of the serial transmission as sent by shift registers 54 and uses them to make and hold a connection, such as interface 31 to interface 42. The remainder of the serial message in our example is transferred directly from interface 31 to interface 42, so that interface 42 sees exactly the same message that interface 31 receives, minus the first eight bits and delayed by the circuit delays encountered by the serial data as it traverses the switching apparatus 14. Switching apparatus 14 does not buffer or re-clock the serial data entering via interface 31 in any manner; it merely reflects as quickly as possible the input waveforms it receives over interface 31 to output interface 42 without changing them in any way, except to strip off the first 8 bits.

The convention for indicating to a switch 14 input port over an interface (such as 31) that there is no transfer in progress, is to issue continuous IDLE commands, which are denoted by the four data lines and the VALID control line being held at logical 0's. The detection of a logical 1 on any of the input lines will signify the departure from the IDLE state and signify to the switch that a selection and transfer is beginning. Likewise, the output lines from the switch will be held in the IDLE state (at all 0's), when there is no active transfer available.

Figure 5:
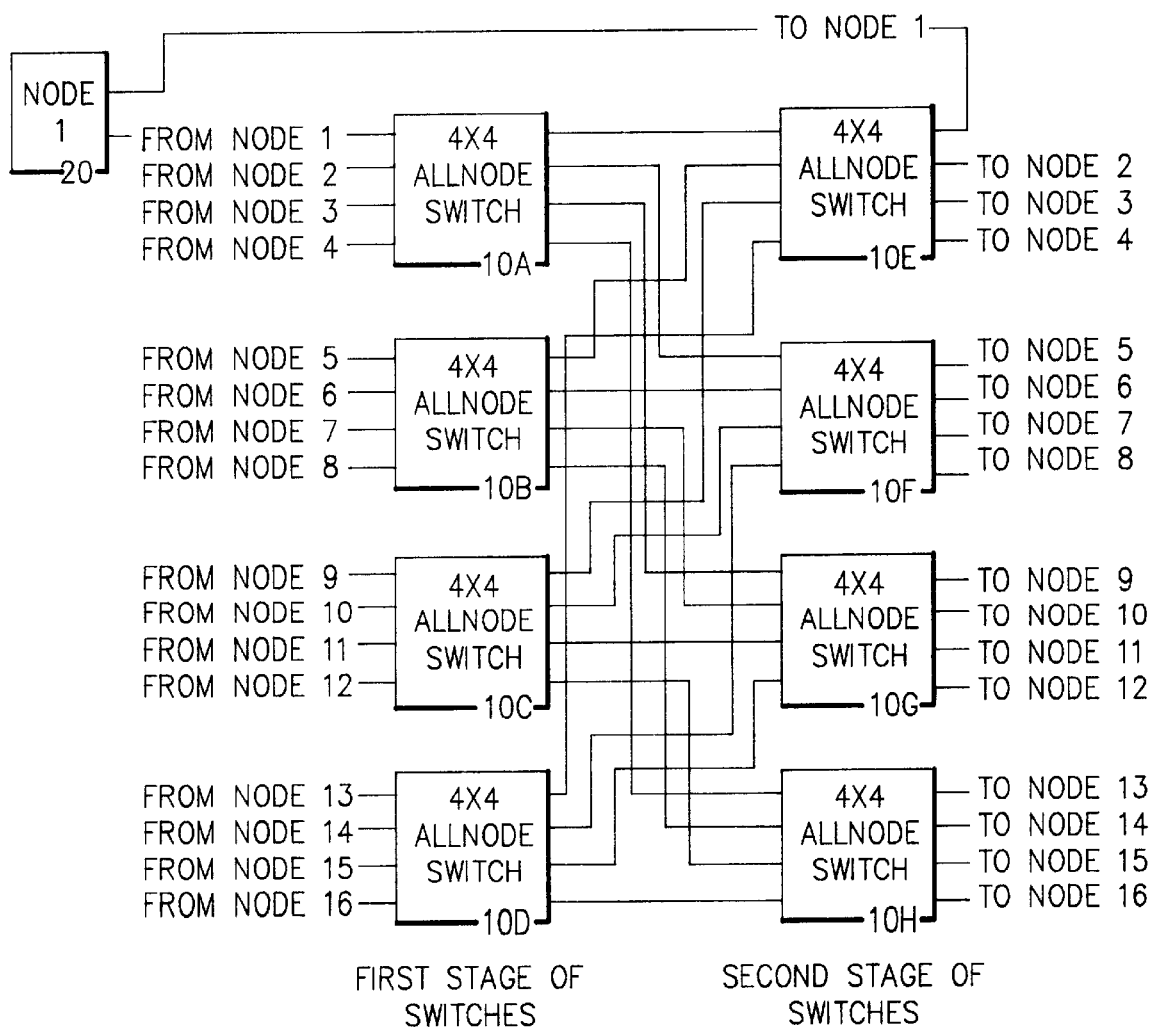
FIG. 5 shows a typical method for cascading the preferred 4×4 embodiment of the invention switching apparatus to accommodate systems having more than 4 nodes.

Referring to FIG. 5, a method is illustrated for increasing the number of nodes in a system by cascading eight switching apparatus 10 blocks. The eight cascaded switches are denoted as 10A through 10H to indicate that they are identical copies of switching apparatus 10, varying only in regards to the wiring of their input and output ports. From FIG. 5 it can be noted that any of sixteen nodes can communicate to any other node over a connection that passes through exactly two of the switching apparatus 10 blocks. For instance, Node 5 can send messages to Node 15 by traversing switch 10B and switch 10H. Since all connections are made through two switching apparatus 10 blocks, the network comprised of the eight switching apparatus 10 blocks is referred to as a two stage switching network. Other multi-stage networks can be configured from switching apparatus 10 blocks by using three stages, four stages, etc. in a similar manner.

Figure 6:
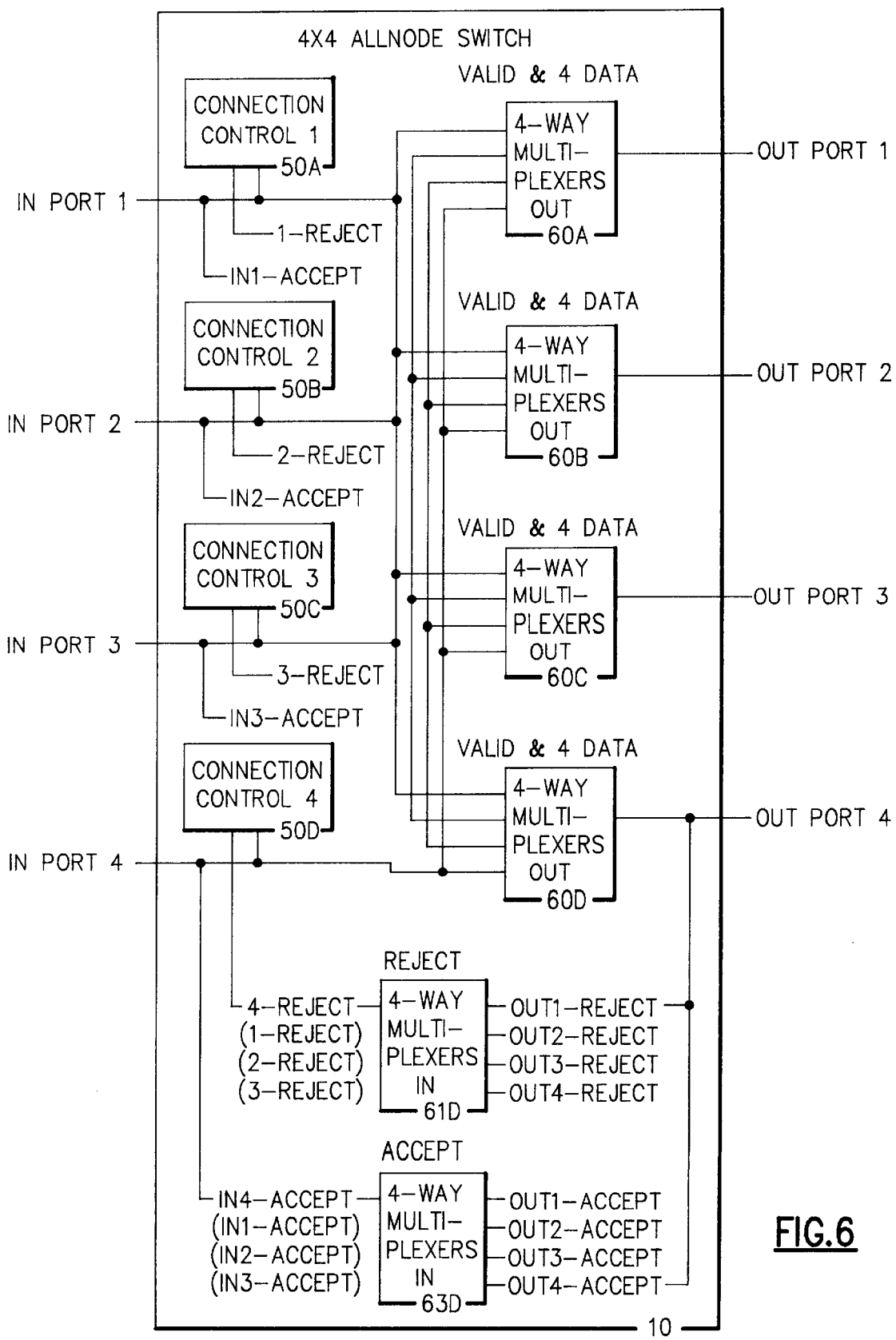
FIG. 6 shows a schematic block diagram of the simple data flow and control path implementations of the invention switching apparatus.

Referring to FIG. 6, a functional diagram of the simple data flow across switching apparatus 10 is illustrated. The VALID and four data lines at- each switch input port, inside the switch, and at each switch output port are represented by a single line in FIG. 6 for simplicity. For instance, the VALID and four data lines entering the switch 10 at input port 1 go to five functional blocks internal to switching apparatus 10; these are blocks 50A, 60A, 60B, 60C, and 60D. Block 50A makes the decision as to which of the four possible output ports to be connected to input port 1. The VALID and four data lines from each input port go to each output multiplexer block (60A, 60B, 60C, and 60D); this makes it possible to connect any input port to any output port. Each of the four output multiplexer blocks (60A, 60B, 60C, and 60D) is uniquely commanded from each of the control blocks (50A, 50B, 50C, and 50D) as to which of the four possible sets of input port lines is to be gated through to each output port. For instance, control block 50A can command multiplexer 60C to connect input port 1 to output port 3, control block 50B can command multiplexer 60A to connect input port 2 to output port 1, control block 50C can command multiplexer 60D to connect input port 3 to output port 4, and control block 50D can command multiplexer 60B to connect input port 4 to output port 2. All four connections are capable of being established simultaneously or at different times. At the same time that multiplexers 60A to 60D form connections to move VALID and data signals across the switch 10 with a unidirectional signal flow from input port to output port, multiplexers 61D and 63D (typical implementations are shown by blocks 61D and 63D—similar blocks are associated with each input port) form signal connections for the REJECT and ACCEPT signals, respectively, with a signal flow in the opposite direction of output port to input port. These REJECT and ACCEPT signals provide a positive feedback indication to switch 10 of actions taken by subsequent switch 10 stages in a cascaded network or by the device receiving and interpreting the VALID and four data signals. A message being transmitted through switch 10 over the four data signals under control of the VALID signal can be REJECTED by any switch 10 stage, if it is unable to establish the commanded connection, or by the receiving device if it is not capable of receiving the message at this time or if it detects an error in the transmission. The receiving device also has the capability of confirming the correct arrival of a message (without errors being detected) by pulsing the ACCEPT signal. Since the REJECT and ACCEPT signals go in the opposite direction of the data flow, they provide a means of reporting back a positive indication to the sender on whether the attempted message transmission was received correctly or rejected.

In general, all switches require a path selection method, whereby they are commanded which connection (input port to output port) to establish. For switching apparatus 10, the path selection command is transmitted to the switch over the same interface that the data is transferred; i.e., the four data lines associated with each input port. Selection information must be transferred prior to the data, so that the commanded interconnections can be established and the data can then flow to the commanded destination. The selection information need NOT identify an input port number (1 to 4), because it is arriving at the switch over a specific input and the switch already knows what input number it is receiving data on. Therefore, the selection information need ONLY specify the number (1 to 4) of the output port of switching apparatus 10 to which to connect. The method of path selection recommended here is one-out-of-N encoding with a return to zero (called a DEAD FIELD).

Figure 7:
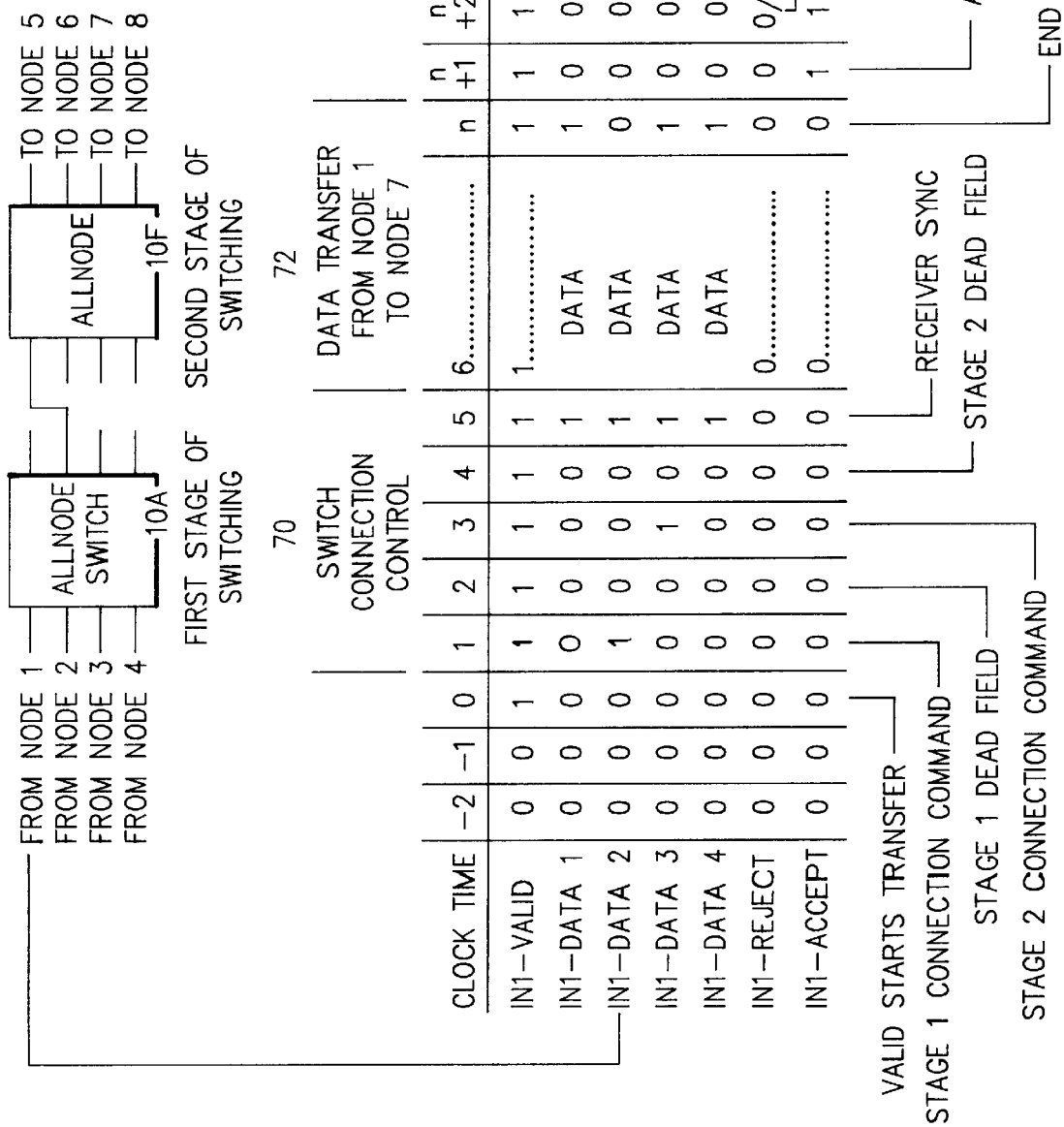
FIG. 7 illustrates the method of selecting and establishing a transmission path through a network comprised of the invention switching apparatus for the purpose of sending data from one node to another.

Referring to FIG. 7, a typical example of the exact serial bit patterns and control signal activation is shown for sending control and data information to switching apparatus 10. The example references the cascaded, two stage switching network shown in FIG. 5 and involves sending data across the network from node 1 through switching apparatus 10A and 10F to node 7. To make this connection, input port 1 must be connected to output port 2 of the first stage switching apparatus 10A, and input port 1 must be connected to output port 3 of the second stage switching apparatus 10F. The signal sequence that is sent to input port 1 to cause the desired connections in switching apparatus 10A and 10F is shown in FIG. 7. In the signal sequence of 1's and 0's, time advances from left to right, so that the values seen at clock time −2 arrive at switch 10A first, and the values at clock time −1 arrive second, etc. The values of the IN1-DATA and IN1-VALID lines are all zeroes and cause nothing to happen at switch 10A during times −2 and −1, because they indicate IDLE. At clock time 0, the IN1-VALID line goes to a logical 1. This prepares switch 10A by enabling the input port 1 to receive data, but no connection or action takes place at switch 10A at this time. The IN1-VALID control line basically enables the corresponding switch input port; when IN1-VALID is a logical 0, switch 10A cannot make any connections or receive any data from input port 1, which is held RESET. Finally, at clock time 1, switch 10A receives its command as to what output port to connect to; the command is received entirely during clock time 1.

The command bit pattern sent at clock time 1 is used by switch 10A to establish connection to an output port; this process is referred to as a path selection operation and takes place completely internally to switch 10A. The path selection approach implemented by the present ALL-NODE switch invention is to let each of the four IN1-DATA lines to define a unique output of switch 10A to be selected. For instance, the IN1-DATA1 signal going to a logical 1 at time 1 tells switch 10A to connect to output port 1, and the IN1-DATA2 signal commands connection to output port 2, etc. In our example, since IN1-DATA2 goes to a logical 1 during clock time 1, switch 10A is thereby commanded to connect to output port 2. In other words, the connection algorithm is that the first data input line going to a logical 1 after an input port has been enabled, defines the connection which that input port is to make: This is a mutually exclusive process, in that for the normal case only one data line at clock time 1 is allowed to be a logical 1; the other three data lines must be 0's. Note that since 1 bit of selection information is guaranteed to be a logical 1, switch 10A will be able to recognize the start of a transmission without requiring any additional bits to signify that a transfer is commencing. The switch 10A makes the commanded connection by removing the four bits from the data lines and storing them in a selection register in control block 50A of FIG. 6. The bits transmitted during clock time 1 are not passed through switch 10A to switch 10F, but instead switch 10A begins passing the very next four bits of data corresponding to clock time 2 to the next switch 10F. However, the information bits following a selection command (those transmitted by the four data lines at clock time 2 in our example) must always be all zeroes (a DEAD FIELD) as shown in FIG. 7. The purpose of this will be explained subsequently.

At clock time 2, the connection of switch 10A input port 1 to output port 2 is established and causes the signal sequence at clock time 2 to be transmitted across switch 10A and the interconnecting wires to switch 10F input port 1. From this time on, switch 10A merely transmits all subsequent data immediately to switch 10F input port 1; it never examines or takes any action on any other data patterns presented to switch 10A over its input port 1 interface. It just passes all data patterns it receives over input port 1 immediately to output port 2 and switch 10F. Thus, at clock time 2, assuming zero delay across switch 10A and its associated cable, switch 10F input port 1 sees the VALID signal rise and the all-zeroes DEAD FIELD on its four data lines. In this way, at time 2, switch 10F input port 1 is enabled in an identical manner to the way switch 10A input port 1 was enabled previously at time 0.

In our example, IN1-DATA3 goes to a logical 1 during clock time 3 and switch 10F is thereby commanded to connect its input port 1 to its output port 3, in a manner similar to the way switch 10A was commanded to connect its input port 1 to its output port 2 during clock time 1. The switch 10F, in making the commanded connection, removes the four bits at clock time 3 from the data lines, and stores them in the selection register which is part of its control block 50A of FIG. 6. The bits transmitted during clock time 3 are not passed through switch 10F to Node 7, but instead switch 10F begins passing the very next four bits of data corresponding to clock time 4 to Node 7. However, the information bits following a selection command (those transmitted by the four data lines at clock time 4 in our example) must always be all zeroes (a DEAD FIELD) as shown in FIG. 7. Thus, by clock time 4, switches 10A and 10F have established a connection path for transferring data directly from Node 1 to Node 7. Up to clock time 5, Node 7 sees nothing but IDLE commands. At time 4, Node 7 sees the OUT3-VALID line from switch IOF go active and is thereby enabled to start receiving data at time 5. From time 5 on, Node 7 can receive data from Node 1 over the 4 OUT3-DATA lines from switch 10F. The protocol of the actual data being transmitted can be any of the normal formats such as Manchester-encoded, 8/10 bit encoding with preamble, etc. However, the preferred embodiment, as shown in FIG. 7 is an all-ones synchronization field at time 5, followed by the NRZ data message. The data message can specify the bit count length of the transfer plus any error detection mechanisms required, such as parity, ECC or CRC. The purpose of the synchronization field of all ones as a prefix to the actual data message, is to enable the receiving node 7 to synchronize to the sending node 1 in one clock time. This assumes that the two nodes involved in the data transfer have clocking systems that are asynchronous to each other, but are operating at the same frequency within a specified tolerance.

The preferred embodiment is to transmit the length of the message first during clock time 6 and clock time 7. Node 7 then decrements the length count starting at clock time 8 and every subsequent clock time, until the length count goes to zero, indicating the end of the data transfer or message (at clock time n in the example). Node 7 can then check the message for accuracy using the selected error detection method (parity, ECC, or CRC). If the message has been received correctly, Node 7 responds by activating the ACCEPT interface line back to switch 10F at clock times n+1 and n+2. Switch 10F passes the ACCEPT indication back to switch 10A, which in turn returns it immediately to Node 1. This indicates to Node 1 that the transfer completed successfully, and Node 1 resets its VALID and four data lines to switch 10A to zeroes, thus, completing the data transfer and returning to the IDLE state. The IN1-VALID input line to switch 10A going to a zero at time n+3, causes switch 10A input port 1 to break its connection to output port 2 and to return to the IDLE state. Immediately, switch 10F sees its IN1-VALID input line go to a zero, breaks its connection to output port 3 and returns to the IDLE state. Thus, the connections can be broken and the switches returned to IDLE in as little as one clock time. If Node 1 has another message to transmit, it can load the next message into buffer 52 and shift registers 54 (FIG. 3), and begin transmission to Node 7 or any other node as soon as time n+4. The only restriction is that the VALID signal generated by Node 1 must return to zero for a minimum of one clock time (time n+3) to signify the end of one transfer before beginning another.

Node 1 has the capability of terminating a data transfer at any time by resetting its VALID and four data lines to switch 10A to zeroes, indicating a return to the IDLE state. This will immediately break all switch 10A and 10F connections, and signify to node 7 that the transfer has been terminated by a return to the IDLE state.

If Node 7 finds an error in the message it has received after the length count has gone to zero at clock time n, it responds by activating the REJECT interface line (instead of ACCEPT) back to switch 10F as shown in FIG. 4. Switch 10F uses the incoming REJECT signal from Node 7 to break its connection to Node 7, to return to the IDLE state, and to pass the REJECT indication back to switch 10A, which in turn returns it immediately to Node 1 after breaking its connections and returning to IDLE. Node 1 then notes that the transfer has been rejected, and returns to the IDLE state by resetting its VALID and four data lines to switch 10A to zeroes. Node 1 may then retry the transmission by reloading shift registers 54 from buffer 52 and starting the transmission over again from the very beginning (clock time −1). The retransmission can occur over the identical path as the previously rejected transmission, or if alternate paths through the network are implemented another path can be tried. If continuous REJECTs are encountered, such that a specified number of REJECTs occur for the same message, an error reporting mechanism may be invoked.

To permit faster network connection breakdown after an ACCEPTed message, a receiving node can optionally issue REJECT one cycle time after issuing ACCEPT (clock time n+2 in our example). This will expedite the network breakdown, since REJECT breaks network connections beginning at the receiver and working its way back to the transmitter, while VALID going to a zero at the transmitter breaks network connections from the transmitter and working its way through the network to the receiver. The transmitter can be designed the recognize whichever indication (ACCEPT or REJECT) that it sees first. The receiver can also REJECT messages which it is not capable of receiving at the present time (for instance, when its receive buffers are full). As described above, the transmitter may retry any REJECTed message.

It is also possible for any switch 10 in a network path to REJECT a message. This can occur for either of two cases:

1) BUSY—If the output port to which the switch is commanded to connect is BUSY (i.e., it is being used by a previously established connection), the switch will signify this condition to the input port issuing the command by activating the REJECT line back to the previous network stage or to the transmitter (if the first stage of the network detects BUSY). For instance, in the example shown in FIG. 7, if 10A had received a command at clock time −2 to connect input port 4 to output port 2, that connection would have been active when input port 1 requested to be connected to output port 2 at clock time 1. In this case, output port 2 is BUSY at clock time 1 and switch 10A would activate the IN1-REJECT line to Node 1. As described above, the transmitter may retry any REJECTed message.

Likewise, the connection could be made successfully at switch 10A, yet output port 3 of switch 10F could be BUSY at clock time 3, causing switch 10F to issue the REJECT signal to switch 10A. This, in turn, causes switch 10A to return REJECT immediately to Node 1 after breaking its connections and returning to IDLE.

2) Simultaneous CONTENTION—Rather than input port 4 establishing a connection to output port 2 in switch 10A at clock time −2 as described above (in advance of the same command from input port 1 at clock time 1), it is possible for two or more input ports to try to connect to the same output port at approximately the same time. This is called CONTENTION for an available output port. For instance, suppose input ports 1 and 4 both sent simultaneous commands at clock time 1 requesting to be connected to output port 2.

The present invention resolves this contention by first connecting both contending input ports 1 and 4 to output port 2. The net effect is to electrically connect the 2 input ports to output port 2, which will logically OR the signals coming from both sources. During clock time 2 the logical OR of the 2 input ports will NOT cause an error, because the values present on both input ports 1 and 4 are identical: the VALID lines for each are logical 1's and the data lines for each contain the DEAD FIELD (logical 0's). However, at clock time 3, the signals from each source could be different and an error could be caused if the 2 input ports both remained connected at clock time 3 and later. In other words, switch 10A has 1 cycle time (clock time 2) to correct the decision it made to connect two or more inputs to the same output. Switch 10A makes this correction during clock time 2 by detecting the fact that more than one input is connected to a given output. It then takes action by resetting all but one of the multiple connections, and does this before clock time 3 occurs. The decision of which connection(s) to reset and which one to keep is a decision based on priority. For the preferred embodiment, a simple priority scheme is used as follows: if input port 1 is contending it gets the connection; if input port 1 is not contending and input port 2 is, input port 2 gets the connection; if input ports 1 and 2 are not contending and input port 3 is, input port 3 gets the connection; and input port 4 gets the connection only if no other input port wants it. Applying the priority selection to our example, input port 1 gets to keep its connection to output port 2, while the connection of input port 4 to output port 2 is reset during clock time 2. This results in the REJECT signal being issued in the normal fashion from switch 10A to input port 4.

Thus, the purpose of the DEAD FIELD in the present invention is to allow one clock time per switch stage to resolve simultaneous contention. The secondary purposes of the DEAD FIELD are to cause a falling edge on the selection bit which was active during the previous clock time, and to compensate for timing skew which might be present across the 4 data lines carrying serial selection data to the cascaded switches. Both the rise and fall of data bits commanding the switches to make connections gives the unclocked switch two signal edges (rise and fall) on which it can trigger and make decisions. These are the only two decision making times available to the ALL-NODE switch.

Figure 8A:
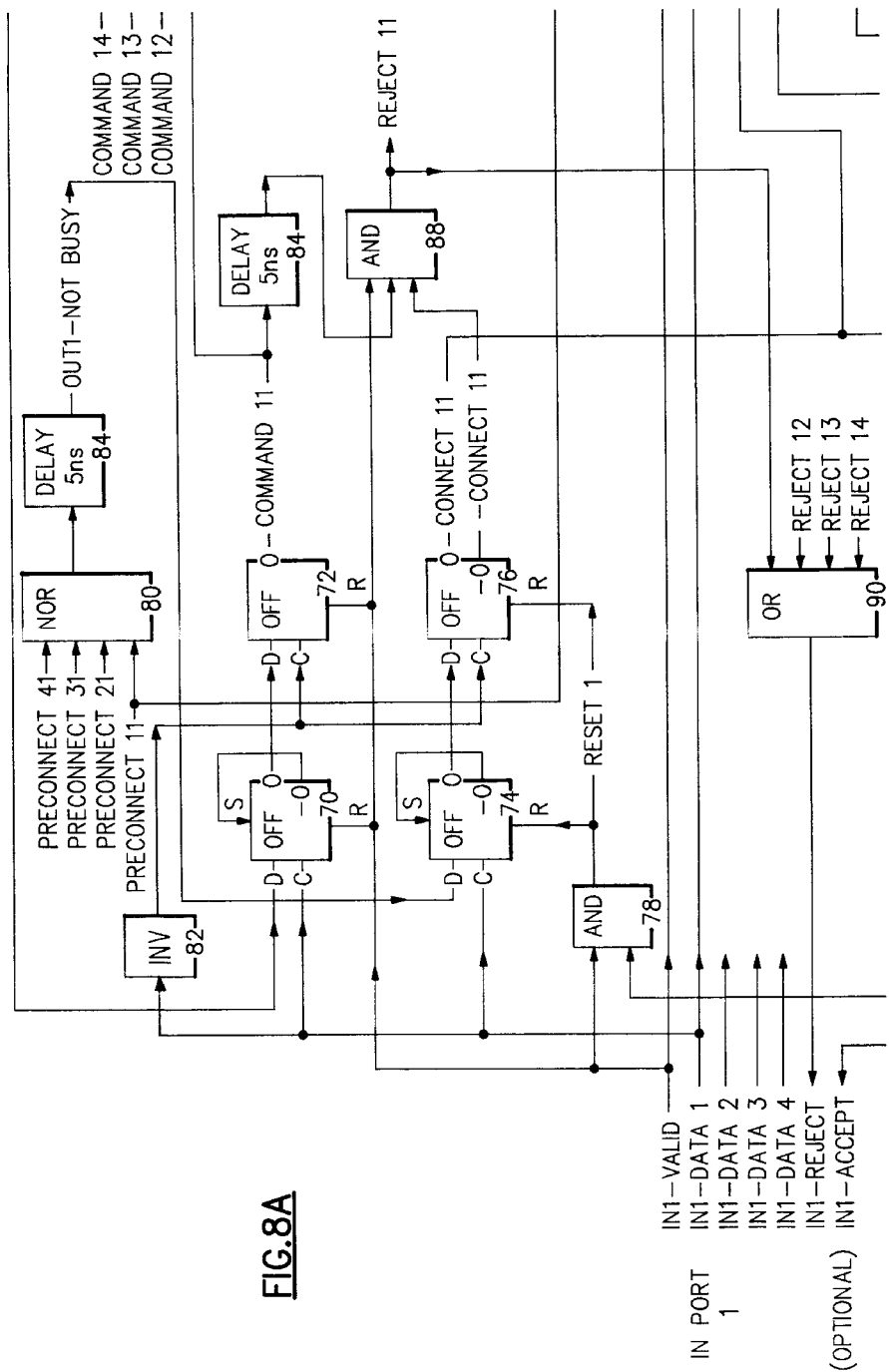
FIG. 8 illustrates the detailed logic implementation for a portion of the invention switching apparatus. The said portion enabling the switch to establish a data transfer connection between input port 1 and output port 1 of the preferred 4×4 switching apparatus embodiment.
Figure 8B:
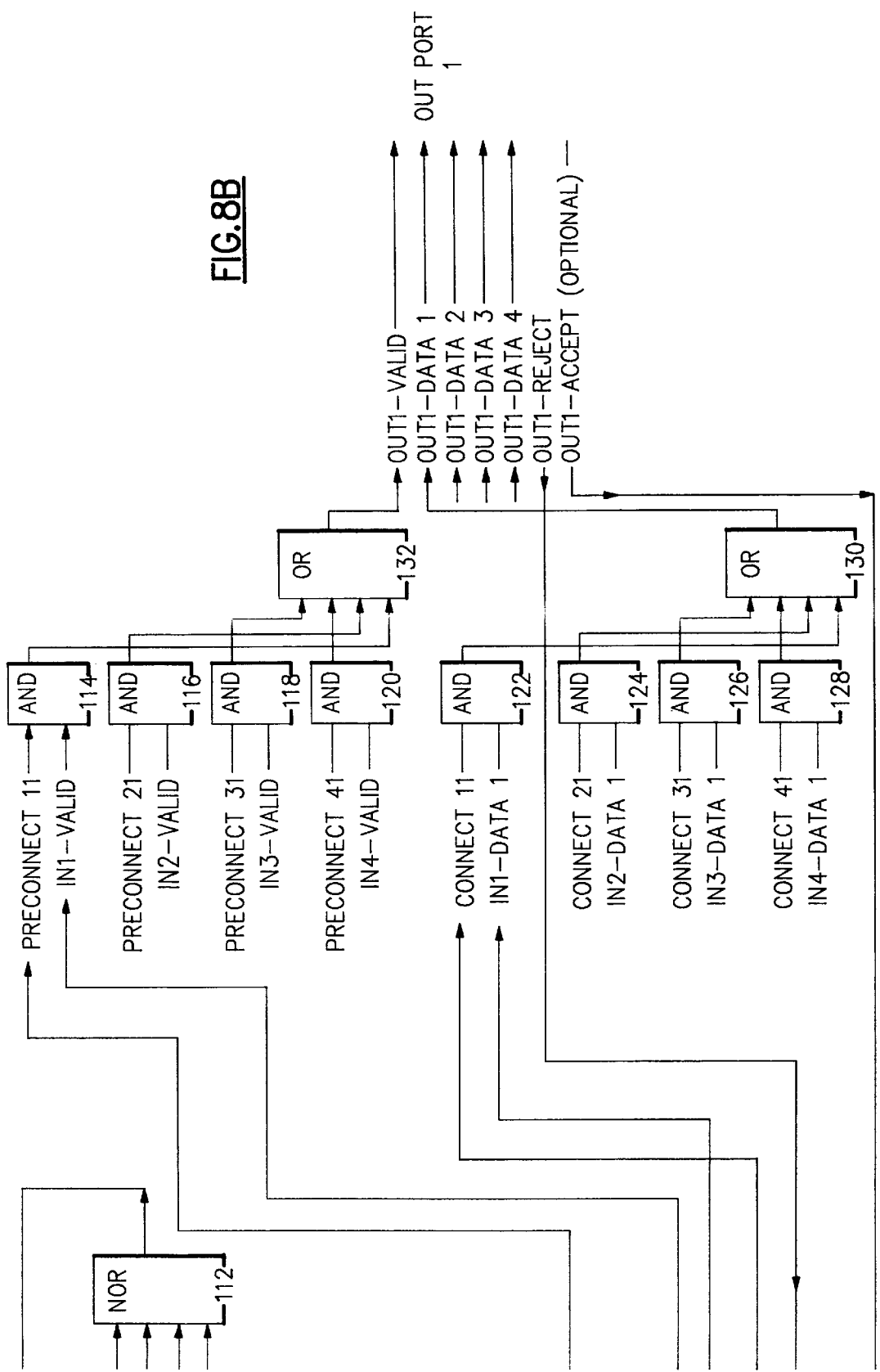
Figure 8C:
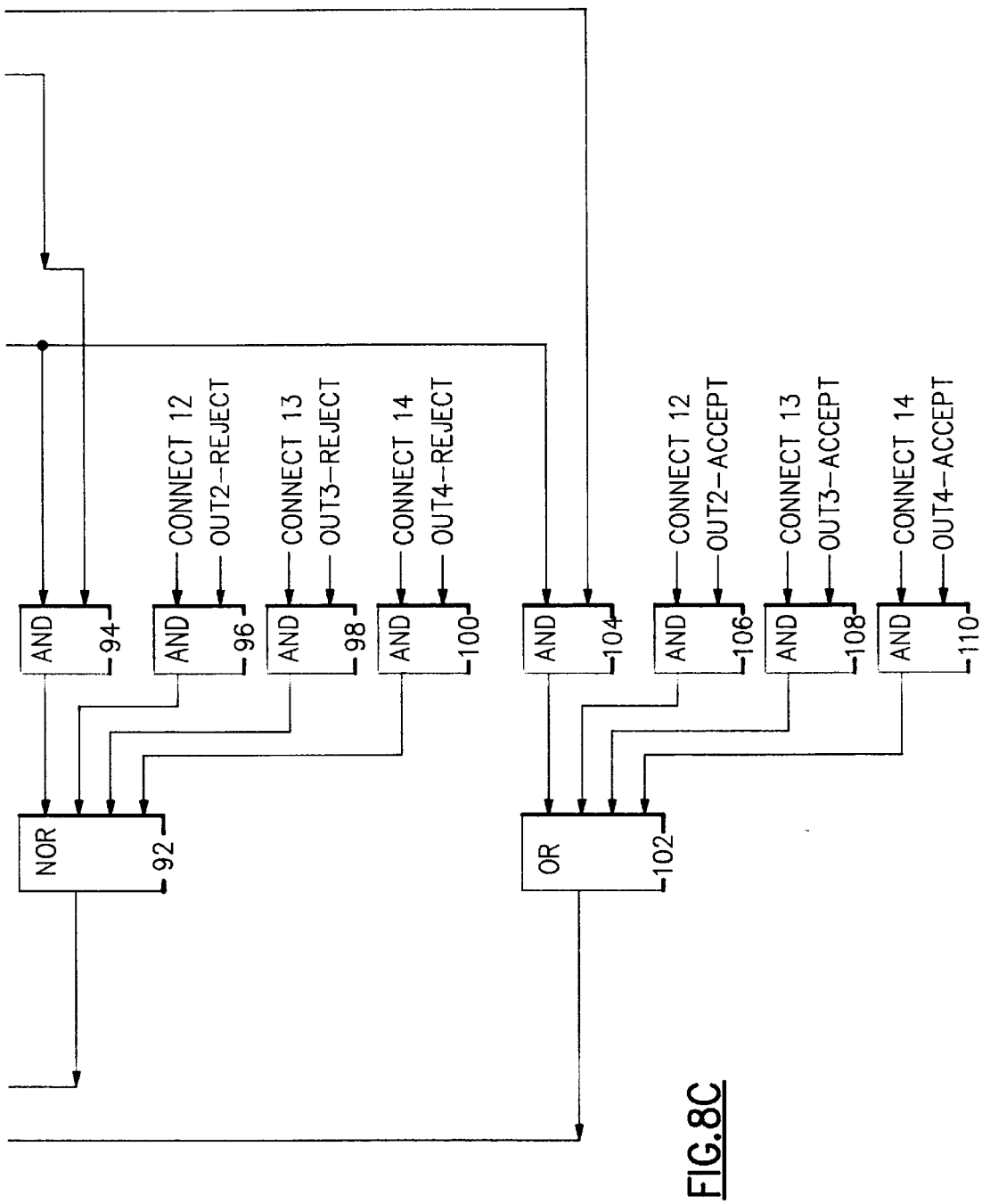
Figure 8:
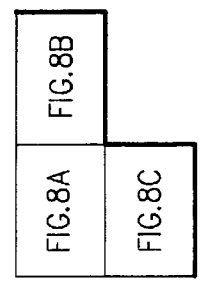

Referring to FIG. 8, the detailed logic implementation of a portion of the invention switch 10 is shown. The said detailed portion shows the logic required to establish and hold a connection between input port 1 and output port 1. This portion contains typical implementations of all the major functional blocks of the switch 10; these functional blocks are merely replicated to form the entire switch 10 capability.

The major function of control block 50A of FIG. 6, which controls the path selection function of switch 10, is implemented by four control DFF latches 70, 72, 74, 76. The IN1-VALID signal from input port 1 is a reset input to these four latches, such that when IN1-VALID is a logical 0 (indicating IDLE), the four latches are all held reset (inactive). IN1-VALID is wired directly to the R (reset) input of latches 70 and 72, and indirectly (first going through AND gate 78) to latches 74 and 76. When IN1-VALID goes to a logical 1, the latches become enabled, so that they are then capable of being set—but they do not get set at this time. Latches 70 and 74 are set simultaneously when IN-DATA1 rises subsequent to IN1-VALID and previous to any of the other three IN1-DATA lines. The first IN1-DATA line to go active is interpreted by switching apparatus 10 as a switch STAGE CONNECTION COMMAND as shown in FIG. 7. In our FIG. 8 example, assume that IN1-DATA1 goes active first. IN1-DATA1 is routed directly to the C (clock) input of latches 70 and 74 and causes them to set if the associated D (data) input is a logical 1. Latch 70 data input coming from NOR gate 112 will always be a logical 1 when the first data line to rise subsequent to IN1-VALID is IN1-DATA1; thus when switch 10 receives a command to connect input port 1 to output port 1, latch 70 will always set at the rise of IN1-DATA1 (this issues a connection command to switch 10). Latch 70 will always set regardless of whether BUSY or CONTENTION conditions exist for output port 1. This is not true for latch 74, which will not set if output port 1 is previously BUSY as indicated by NOR gate 80 through delay 84 to the data input of latch 74. The feedback of the -Q output signals from latches 70 and 74 to their respective S (set) inputs is for the purpose of continually keeping the latches set after they have been initially set by the C and D inputs. Thus, once set, latches 70 and 74 will remain set until a reset is signaled; i.e., the waveforms on the C and D inputs will have no further effect on the state of the latches 70 and 74.

Gate 82 inverts the IN1-DATA1 signal and sends it to the C inputs of latches 72 and 76. Since the D inputs connect to the Q outputs of latches 70 and 74, respectively, latches 72 and 76 assume the values of latches 70 and 74, respectively, but not until IN1-DATA1 falls (at the beginning of the subsequent DEAD FIELD). At this time latch 72 records and holds the fact that COMMAND 11 has been issued; i.e., that a command has been issued to connect input port 1 to output port 1 (denoted by 11). Latch 76 performs the actual connection of 11 (if output port 1 is NOT BUSY) by setting its Q output indicating CONNECT 11; or latch 76 indicates that it cannot make the connection because output port 1 is BUSY by activating its -Q output of -CONNECT 11.

The CONNECT 11 signal generated by latch 76, when active, is used to establish the direct connection of six interface lines between input port 1 and output port 1. The four data lines of input port 1 become connected to the four data lines of output port 1 through multiplexers 60A shown in FIG. 6. The details of a typical connection is shown by AND gate 122 and OR gate 130: CONNECT 11 going active to AND gate 122 causes the output of AND gate 122 to follow directly the values on IN1-DATA1 which is gated through OR gate 130 to OUT1-DATA1. The other AND gates 124, 126, and 128 feeding OR gate 130 will all be held to logical 0's and have no effect on gate 130; this is because normally only one CONNECT signal can be active at any given time, thus enabling a connection to a specified output port. Therefore, if CONNECT 11 is active to gate 122, CONNECT 21, 31 and 41 to gates 124, 126, and 128, respectively, must all be inactive. Note that the connection (CONNECT 11) is made during the DEAD FIELD time subsequent to the Stage Connection Command; this is what causes the path selection command not to be forwarded to output port 1. Instead, it is stripped from the serial data being passed through switch 10, and held in latches 72 and 76.

Similarly, CONNECT 11 causes two other control signals to be connected between input port 1 and output port 1—the REJECT and ACCEPT signals—however, these two signals have the opposite direction of flow from the data lines. Gate 94 shows CONNECT 11 selecting OUT1-REJECT as the source of an internal REJECT signal generated by NOR gate 92. In this case AND gates 96, 98, and 100 are all held inactive; i.e., the CONNECT 12, 13, and 14 signals are all zeroes because input port 1 can only be connected to one output port (in this case, output port 1) at any given time.

Likewise, gate 104 causes the OUT1-ACCEPT line to be connected to the IN1-ACCEPT line through OR gate 102, while gates 106, 108, and 110 are held inactive.

The only interface signal not interconnected by CONNECT 11 is the VALID signal. This is because the connection of IN1-VALID to OUT1-VALID is made sooner than the other connections: it is controlled by the PRECONNECT 11 latch 74 which sets one clock time earlier than latch 76. AND gate 114 is thus enabled by PRECONNECT 11 and causes IN1-VALID to be connected to OUT1-VALID through OR gate 132 in a manner similar to the way the other connections are made but occurring a clock time sooner to enable the next stage.

AND gate 88 is involved in detecting the REJECT condition of input port 1, which occurs when the switching apparatus 10 is not able to establish the commanded connection to output port 1 because of a BUSY condition. REJECT is detected as the logical AND of COMMAND 11 delayed through block 86, IN1-VALID being active, and -CONNECT 11 being active, indicating that the connection cannot be made due to the BUSY condition. The delay block 86 is necessary to insure that a race condition between latches 72 and 76 changing at the same clock time does not cause gate 88 to glitch erroneously. Gate 88 detecting a REJECT 11 sends this indication to input port 1 through gate 90 to IN1-REJECT. Gate 90 is an OR of all the possible reject conditions (REJECT 11, REJECT 12, REJECT 13, and REJECT 14). The response of the transmitter to input port 1 to IN1-REJECT is to return IN1-VALID to zero (IDLE). This causes latches 70, 72, 74, and 76 to reset to the IDLE state, which makes the inputs to gate 90 inactive and resets the REJECT condition. Anytime IN1-VALID goes to a zero, whether at the end or in the middle of a normal transfer, or because a REJECT is issued, the response of switch 10 is always the same—latches 70, 72, 74, and 76 all are reset and input port 1 of switch 10 returns to the IDLE state.

The switch apparatus 10, upon receiving a reject from a subsequent cascaded switch apparatus or the receiving device, is informed by the OUT-REJECT line. Referring to FIG. 8, for example, assume that switch 10 is successful in making its connection from input port 1 to output port 1 by setting CONNECT 11 (latch 76) as described previously. If later it receives a reject indication by OUT1-REJECT going active, it will respond as follows: OUT1-REJECT is passed through gates 94, 92, and 78 to cause RESET 1 and, thereby, reset latches 74 and 76. Latches 74 and 76 being reset break the connection through switch 10 of input port 1 to output port 1 causing the OUT1-DATA lines and OUT1-VALID to go to the zero IDLE state. This propagates IDLE to the subsequent cascaded switch apparatus or the receiving device and causes the OUT1-REJECT line to go inactive. Latch 76 being reset causes gate 88 to detect the REJECT 11 condition and to propagate the reject indication to IN1-REJECT through gate 90 and thus informing the previous switch 10 stage or transmitting device of the reject condition. Switch 10 will continue to transmit the reject indication to input port 1 until it receives an IDLE command.

Gate 80 detects output port 1 busy conditions and is delayed by block 84 for the purpose of allowing input ports 1 to 4 to operate synchronously, if desired. In this case, if all four inputs tried to select output port 1 at approximately the same time, there could be a possible logical race condition occurring between the D and C input signals to latch 74 and the other similar latches for input ports 2 to 4 (PRECONNECT 21, PRECONNECT 31, and PRECONNECT 41) that feed gate 80. The purpose of delay block 84 is to delay this effect and to eliminate this race condition. In asynchronous operation, this race condition also exists if two input ports are contending for the same output port and both issue connection commands which happen to be separated in time by approximately the value of delay caused by block 84. In this case, it is possible for the latch 74 data input to be changing at the same time its clock input is rising, and causing a possible metastable condition at latch 74. As long as this metastable condition resolves itself within one clock (before latch 76 is clocked) and latch 74 goes to either stable condition (0 or 1), the metastability will be corrected in the prescribed manner of using double latching (74 and 76). If the metastability condition does not settle out in time and causes an error, the receiving device will detect an erroneous message, issue a reject, and cause a retransmission. If the metastability condition causes the switch to hang in an unusual state which does not lead to a reject, the transmitting device will time out, issue the IDLE command, and then retransmit the message. This is the only possible occurrence of metastability in the present invention; it is an unusual condition which is not normally encountered in the switch operation and it can be corrected on the mere chance that it does occur.

NOR gate 112 detects any active command from input port 1. It detects the very first command issued after IN1-VALID going active and then prevents any of the other commands (COMMAND 11, COMMAND 12, COMMAND 13, or COMMAND 14) from setting by causing the data input to latch 70 and similar latches associated with input port 1 to go to zero. Thus, only the first connection command will be recognized from any input port.

Figure 9A:
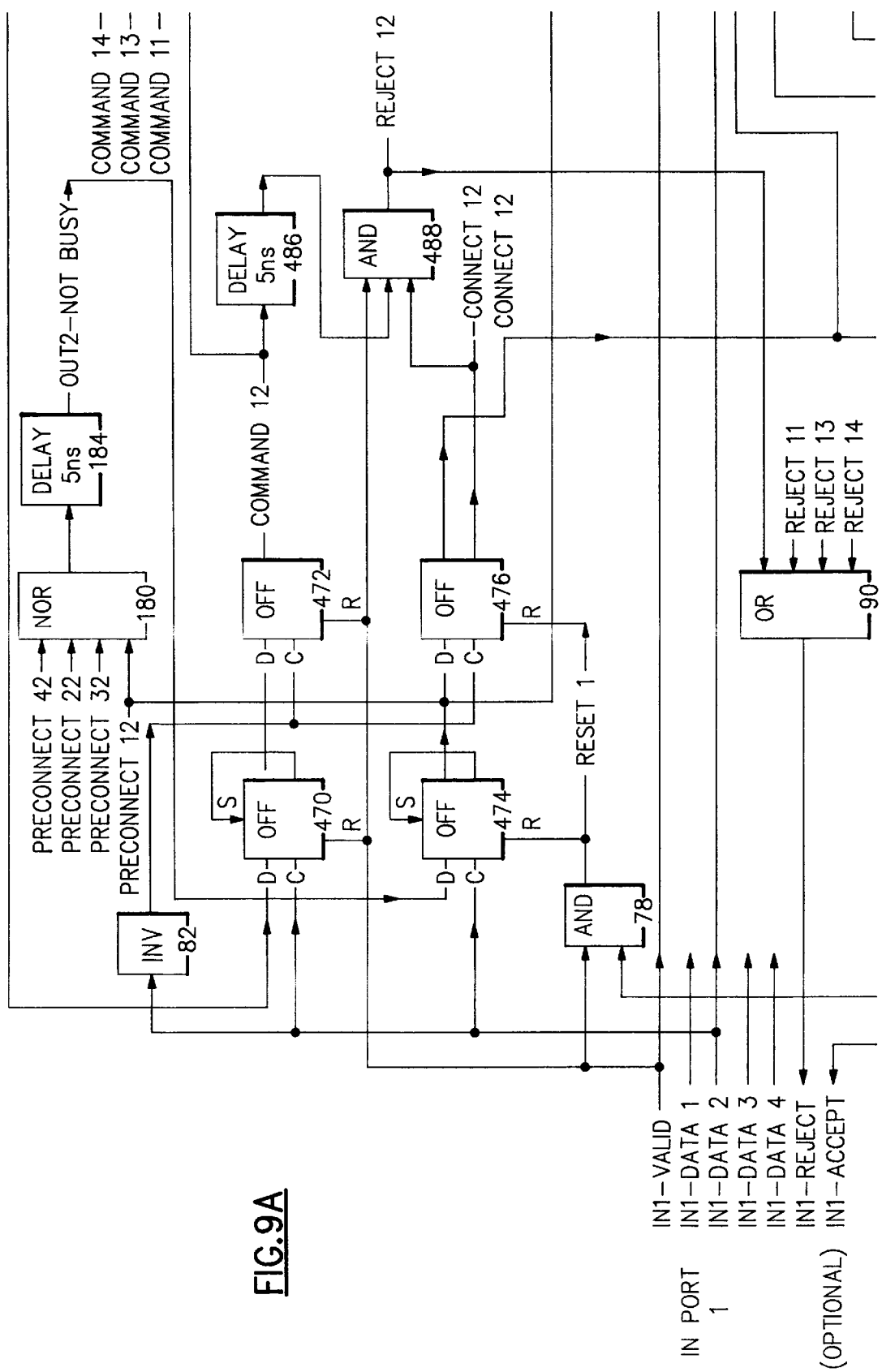
FIG. 9 illustrates the detailed logic implementation for a portion of the invention switching apparatus. The said portion enabling the switch to establish a data transfer connection between input port 1 and output port 2 of the preferred 4×4 switching apparatus embodiment.
Figure 9B:
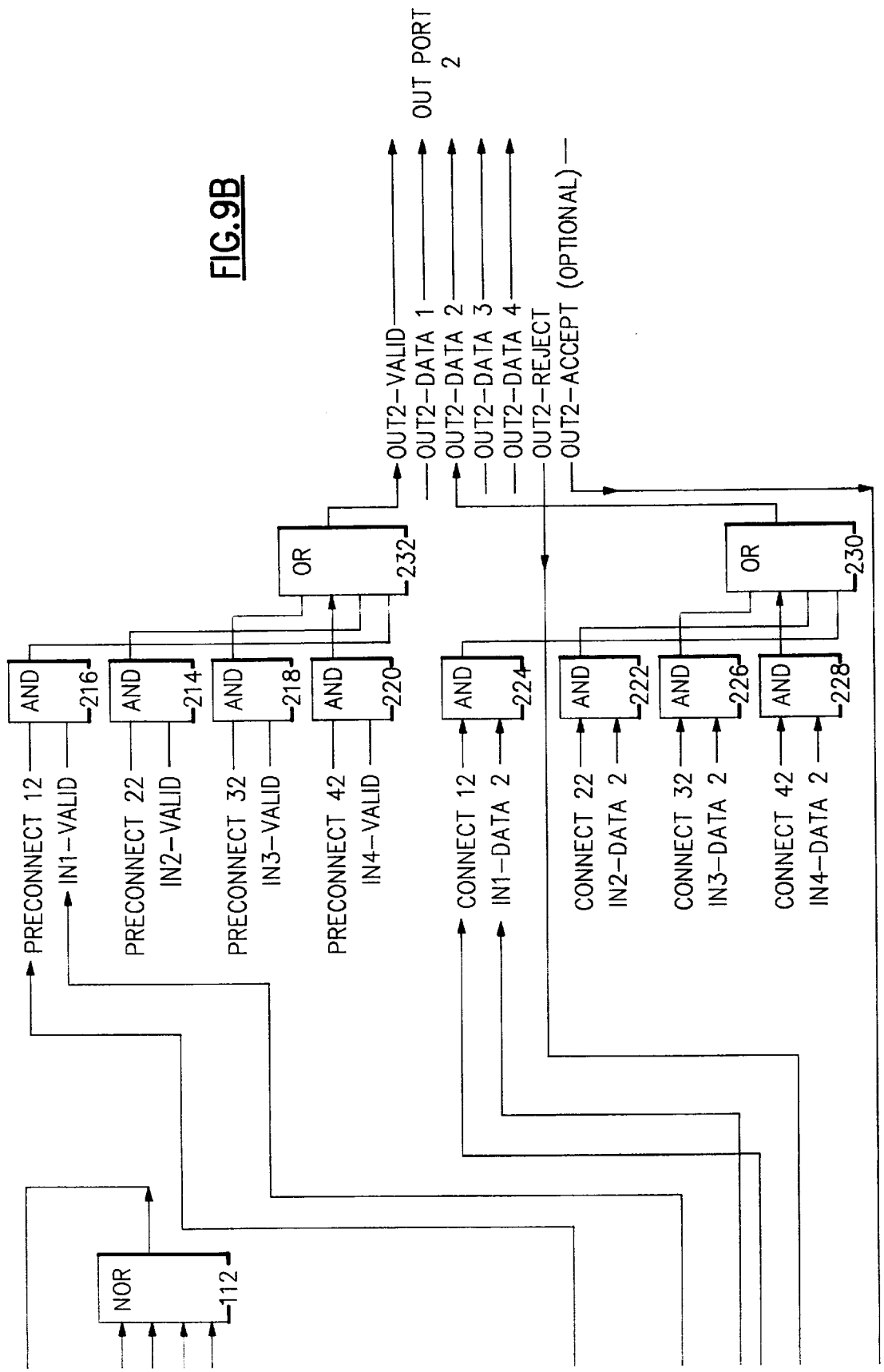

Referring to FIG. 9, similar logic to FIG. 8 is shown but this logic controls the connection of input port 1 to output port 2. All the gates have exactly the same functions as they did in FIG. 8, except that they apply to output port 2, instead of output port 1. Some of the gates in FIG. 8 can be reused in FIG. 9 without being duplicated; these gates retain the same numbers as they had in FIG. 8. Some of the gates in FIG. 9 perform functions identical to the functions performed in FIG. 8 but relate to output port 2 instead of output port 1; these gates must be unique for output port 2 and are assigned new numbers to indicate their uniqueness as compared to the gates in FIG. 8.

Figure 10A:
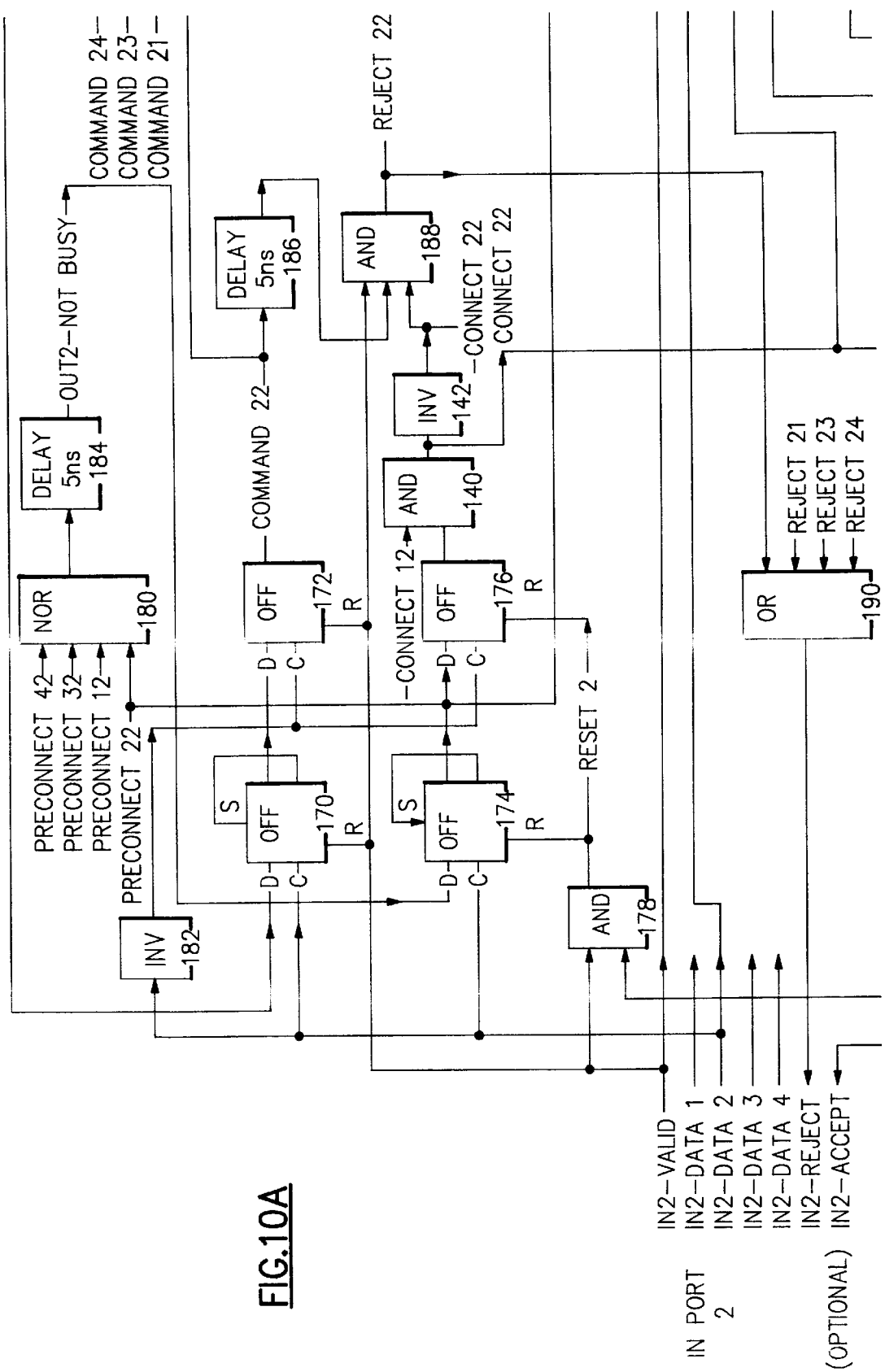
FIG. 10 illustrates the detailed logic implementation for a portion of the invention switching apparatus. The said portion enabling the switch to establish a data transfer connection between input port 2 and output port 2 of the preferred 4×4 switching apparatus embodiment.
Figure 10B:
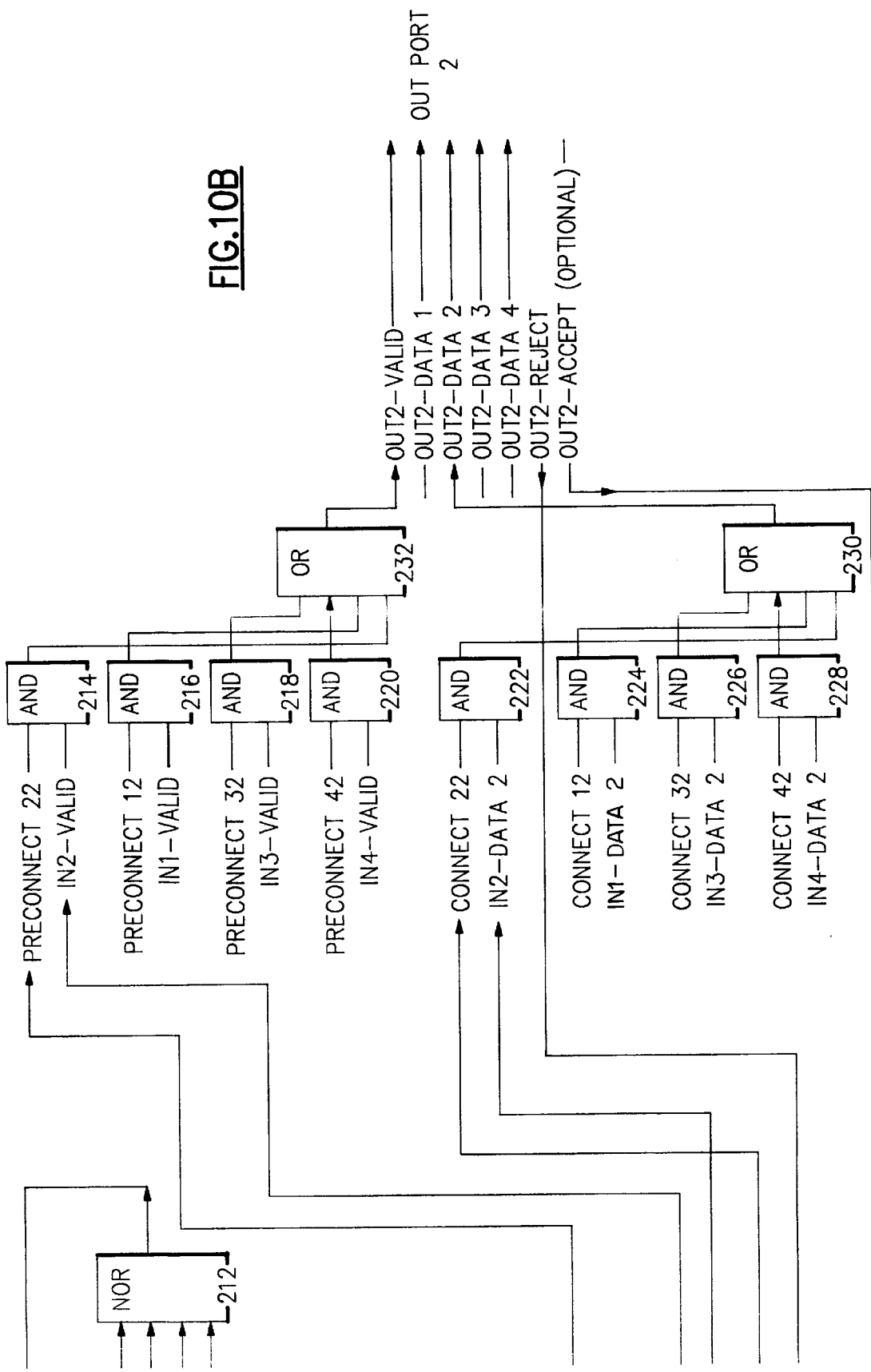
Figure 10C:
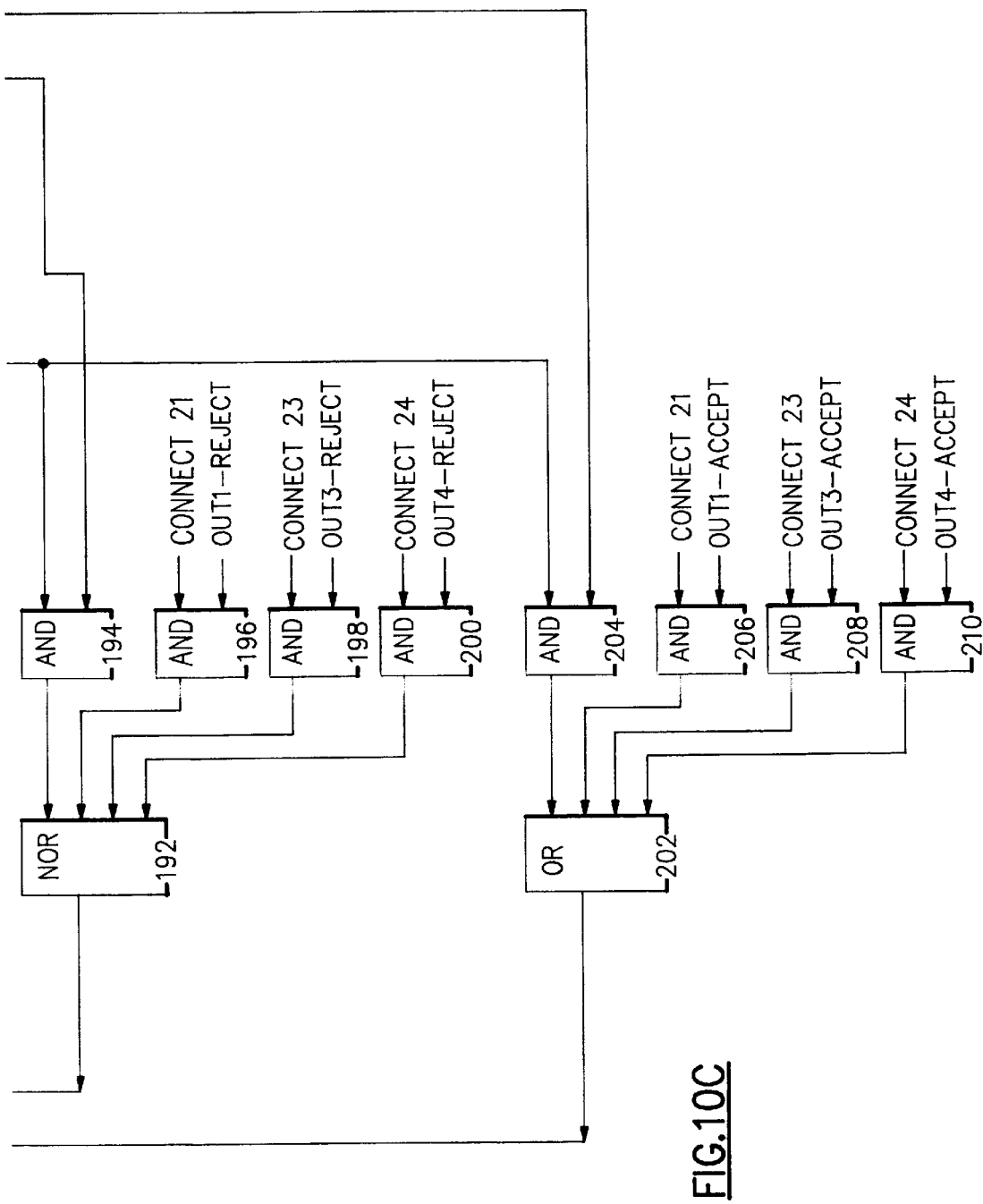
Figure 10:
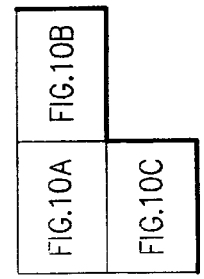

Note that input port 1 does not require any logic to handle CONTENTION conditions, because of the contention resolution algorithm that assigns the highest priority to input port 1. Referring to FIG. 10, similar logic to FIG. 8 is shown but this logic controls the connection of input port 2 to output port 2. All the gates have exactly the same functions as they did in FIG. 8, except that they apply to input port 2 and output port 2, instead of input port 1 and output port 1. Now, however, contention resolution is required and two new gates 140 and 142 are involved. Latch 176, which corresponds to latch 476 (CONNECT 12) in FIG. 9, does not in this case generate the CONNECT 22 signal, but rather CONNECT 22 is generated through gate 140, which says to activate CONNECT 22 only if -CONNECT 12 is active. Thus, if latches 476 and 176 set simultaneously indicating that both input port 1 and input port 2 are contending for the use of output port 2, input port 1 will win (CONNECT 12 will remain active), and input port 2 will lose (CONNECT 22 will be forced to the inactive state by gate 140). Gate 142 detects -CONNECT 22 and causes REJECT 22 to be generated to input port 2. The state of CONTENTION can only be detected in the time period before gate 184 detects the BUSY condition and if two or more selection commands arrive in this brief time slot. Therefore, it is necessary to restrict the delay of block 184, such that it does not cause the contention resolution period to extend beyond the time provided by one DEAD FIELD.

It is possible that under contention conditions that CONNECT 22 might lose, and CONNECT 12 might win, yet subsequently be rejected in the next stage before latch 176 has been reset. In this case, it might appear that the CONNECT 22 option has been re-established because gate 140 might go active momentarily. However, the transmitter will have noted the IN2-REJECT signal going active and it will return input port 2 to the IDLE state and retransmit the message from the beginning, even if the IN2-REJECT is withdrawn prematurely.

Figure 11A:
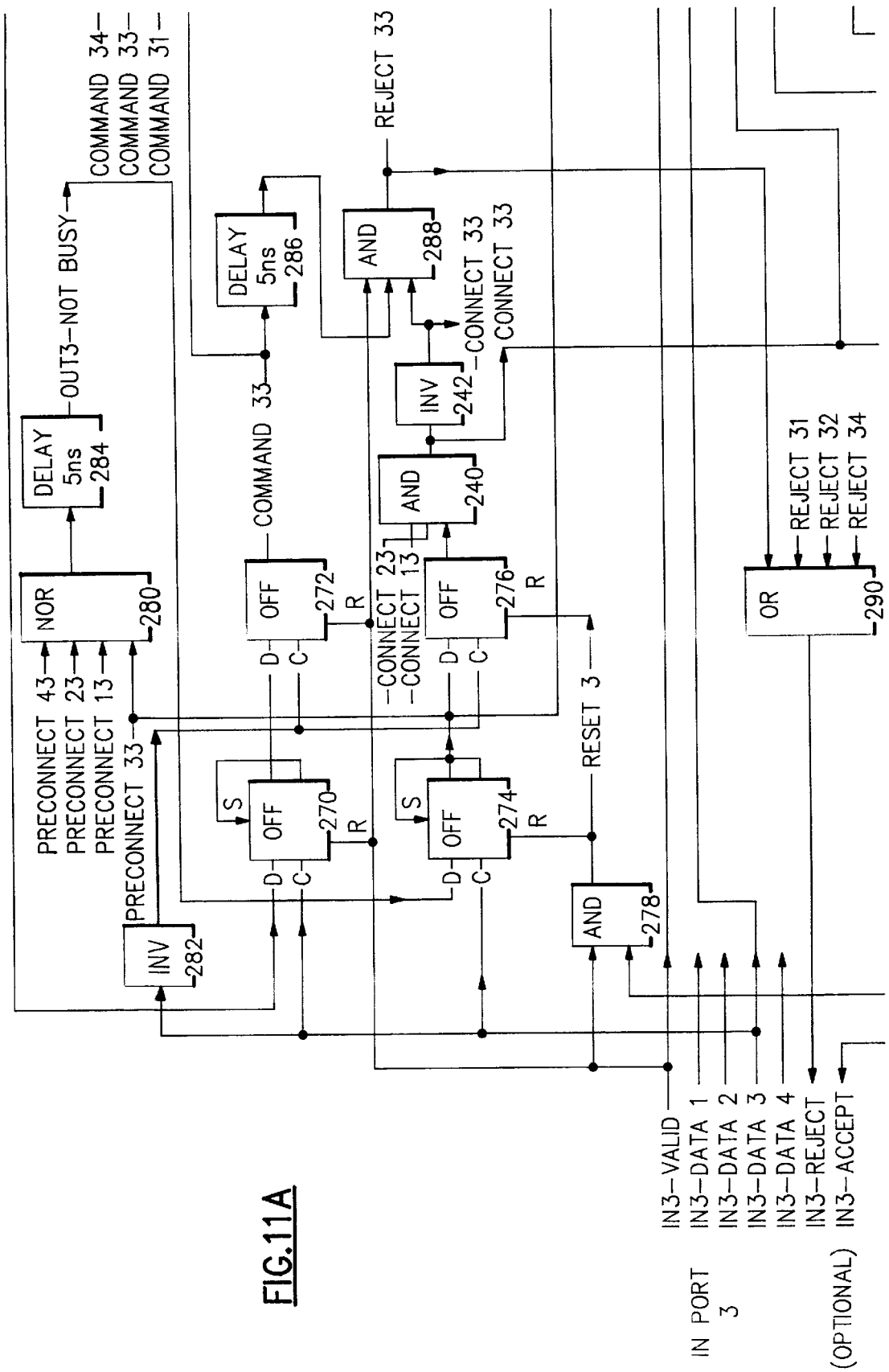
FIG. 11 illustrates the detailed logic implementation for a portion of the invention switching apparatus. The said portion enabling the switch to establish a data transfer connection between input port 3 and output port 3 of the preferred 4×4 switching apparatus embodiment.
Figure 11B:
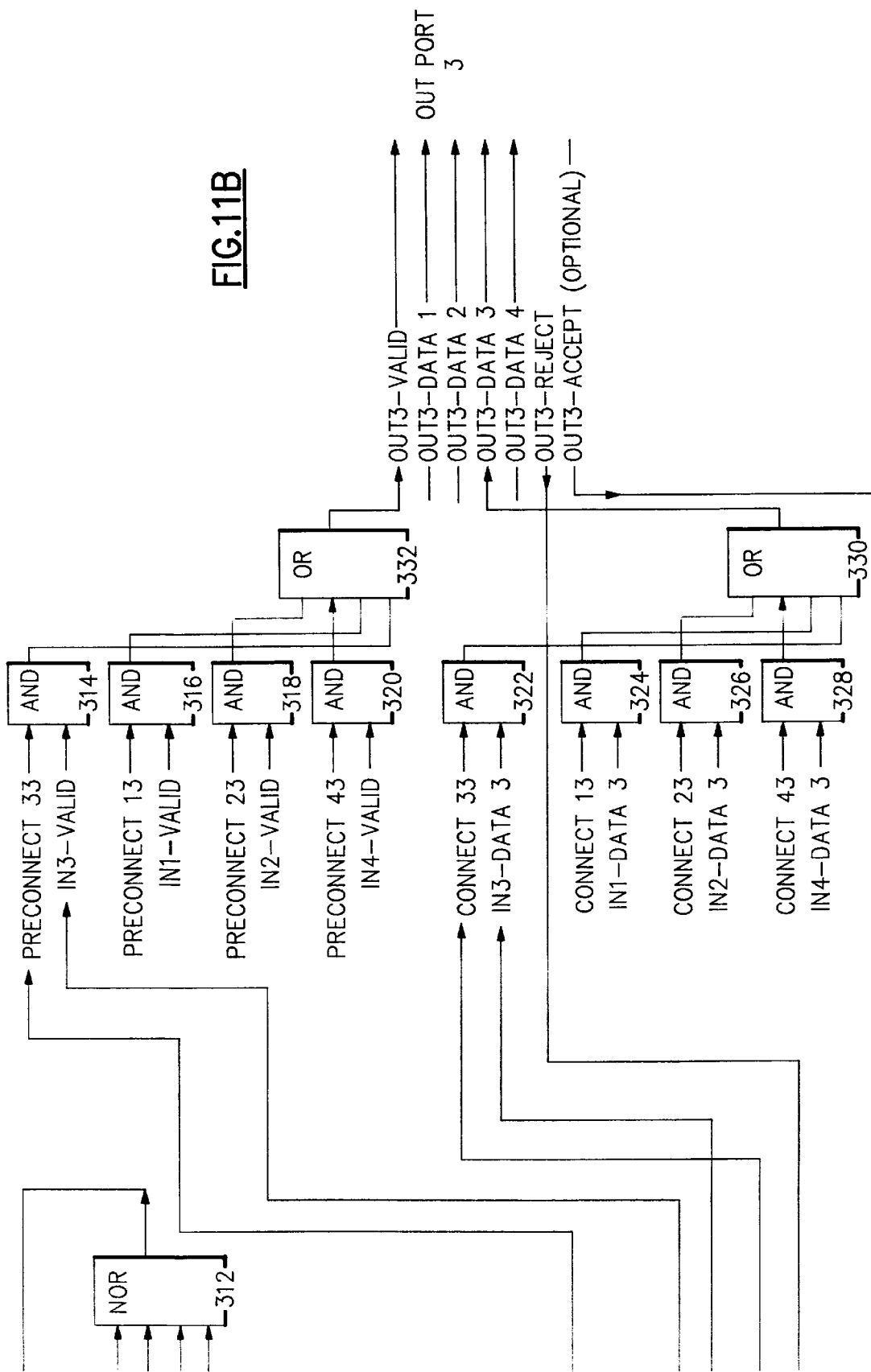

Referring to FIG. 11, similar logic to FIG. 8 is shown but this logic controls the connection of input port 3 to output port 3. All the gates have exactly the same functions as they did in FIG. 8, except that they apply to input port 3 and output port 3, instead of input port 1 and output port 1. The unique functons shown in FIG. 11 are gates 240 and 242, which deal with the output port 3 CONTENTION conditions and show that input port 3 will be connected to output port 3 (CONNECT 33) only if input ports 1 and 2 are not contending at the same time for output port 3. If either of them are, input port 3 will lose and receive IN3-REJECT based on the input to gate 288 provided by gate 242.

Figure 12A:
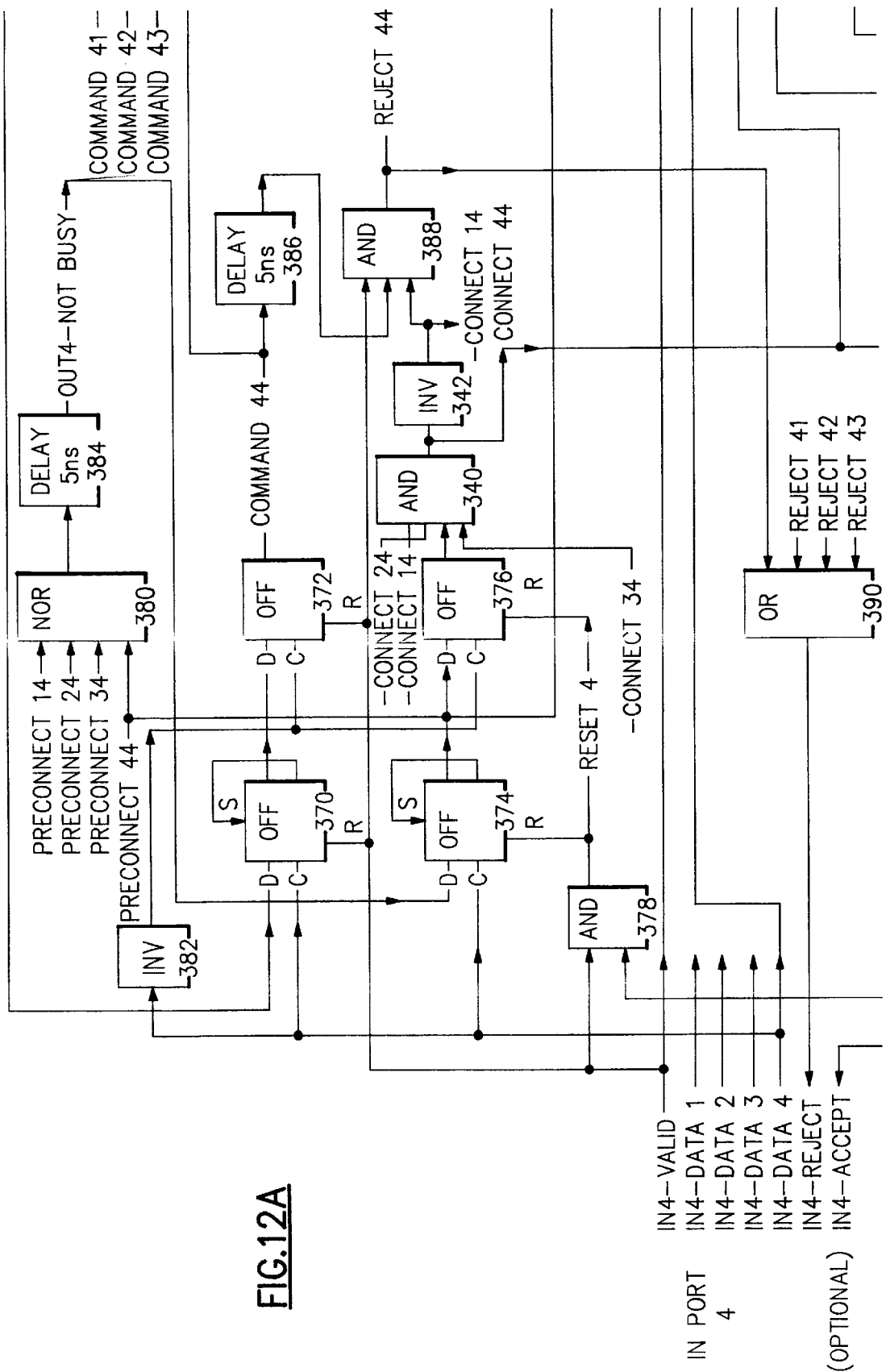
FIG. 12 illustrates the detailed logic implementation for a portion of the invention switching apparatus. The said portion enabling the switch to establish a data transfer connection between input port 4 and output port 4 of the preferred 4×4 switching apparatus embodiment.
Figure 12B:
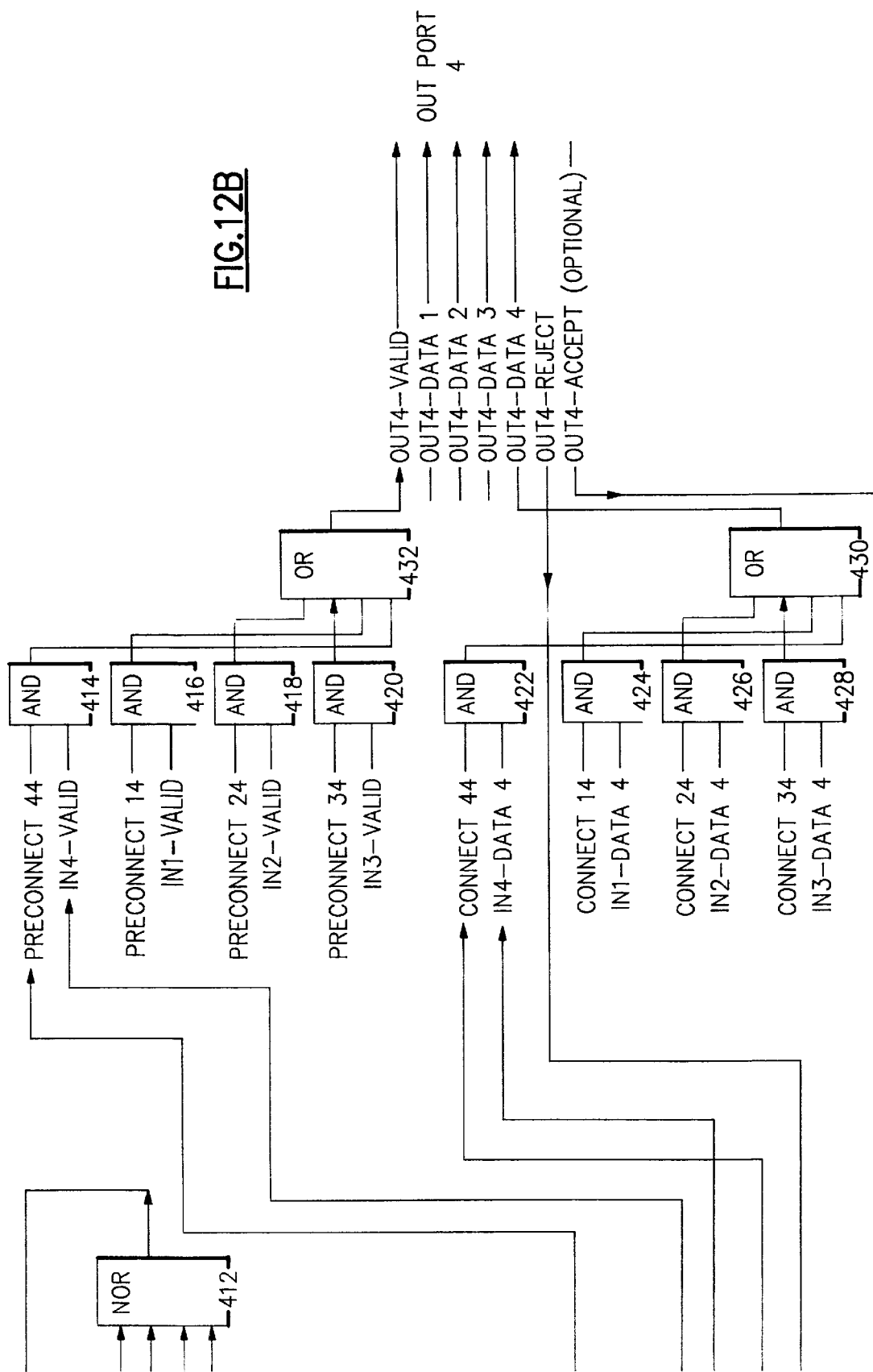
Figure 12C:
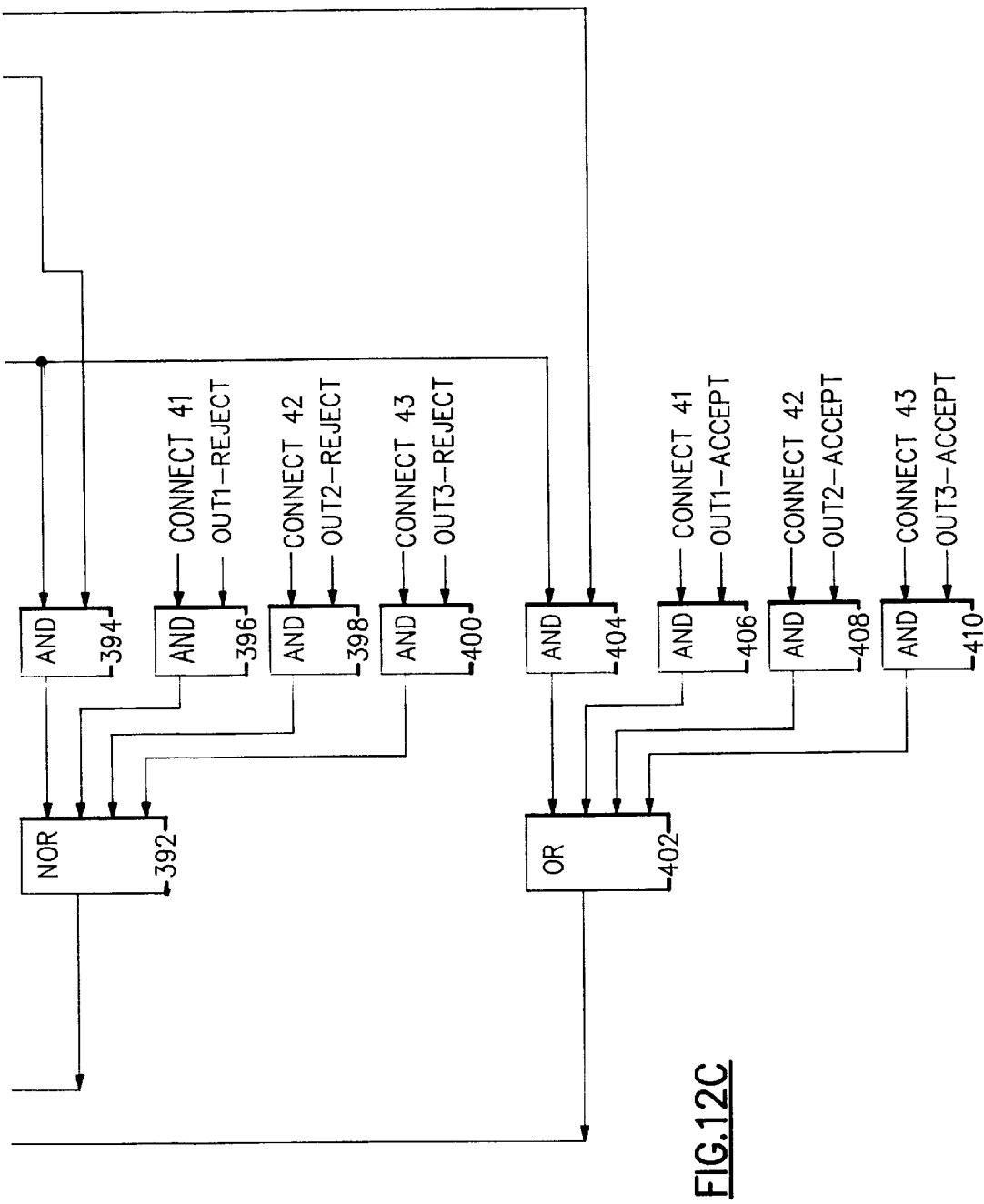
Figure 12:
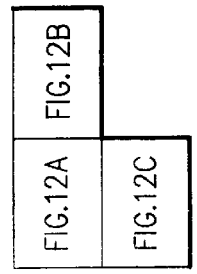

Referring to FIG. 12, similar logic to FIG. 8 is shown but this logic controls the connection of input port 4 to output port 4. All the gates have exactly the same functions as they did in FIG. 8, except that they apply to input port 4 and output port 4, instead of input port 1 and output port 1. The unique functions shown in FIG. 12 are gates 340 and 342, which deal with the output port 4 CONTENTION conditions and show that input port 4 will be connected to output port 4 (CONNECT 44) only if input ports 1, 2, and 3 are not contending at the same time for output port 4. If any of them are, input port 4 will lose and receive IN4-REJECT based on the input to gate 388 provided by gate 342.

FIGS. 8 to 12, show all the unique circuit implementations required by switch 10. Eleven further replications of the same functions shown in FIG. 8 are required to totally define switch 10 to provide connections from input port 1 to output port 3, input port 1 to output port 4, input port 2 to output port 1, etc. However, these implementations are an obvious extension of FIGS. 8 to 12 and are not shown here.

Other Preferred Embodiments

Other embodiments which we may prefer to use in certain instances are within the scope of our inventions and will be described by way of example of changes to the preferred embodiment which has been described with reference to the drawings.

For example, the switching apparatus 10 can function adequately even if the ACCEPT interface line is eliminated from all input and output port interfaces. In this case, the transmitting device could terminate a message by going to the IDLE state as soon as it had finished transmitting the entire message, and would not have to wait for an ACCEPT signal to be returned. The protocol to be used in this case would be that if the transmitting device completed the full message transmission without receiving a REJECT indication, then that message would be assumed to have been transmitted successfully. The message would have to be long enough to guarantee that any REJECT indications due to switch BUSY or CONTENTION conditions or to the receiver buffers not being available could be reported back to the transmitter before it assumed that the transmission was successful. Any error conditions detected by the receiving device could be reported back to the transmitting device by a separate message going in the opposite direction.

For example, the switching apparatus 10 can function adequately if the size of the DEAD FIELD is increased from one clock time to m clock times, where m=2 or more.

For example, the switching apparatus 10 is not restricted to four input ports and four output ports, but could be any number of I input ports and Z output ports, where I and Z can be independent values ranging from two to any large number, so long as the number of data lines per input and output port are equal to or greater than Z.

In general we have provided an arbitration switch for receiving data signals from a plurality of different sources in an asynchronous digital communication network and for transmitting those signals to a destination, said number being greater than two. The preferred switch has a number of input ports, one for each of said number of different sources, to receive the respective data signals from each of the different sources. The switch has an arbitration circuit means coupled to all of said respective input ports to receive the respective data signals and select a set of data signals to be received for subsequent transmission to said destination. There can be a number of lock path circuits for each input port and responsive to the set of data signals to be received by said arbitration circuit to couple said destination to receive said first set of data; and an output port coupled to each of said input ports and such that the arbitration circuit receives data signals from the input port selected by the arbitration circuit and for transmitting the signals to said destinations. In such a circuit we provide a common line to transmit 1s and 0s on the same line for connecting multiple inputs to multiple outputs. The switch is non-buffered, and there is no need for queuing. We use a DEAD FIELD to provide the time for resolving contention. This is a continuous flow switch where data flows through the switch without handshaking in a single pass. There are no hold-offs or wait periods, or any discontinuation or interruption of message transmittals.

The switch uses parallel discrete selection bits for path selection among a plurality of switch inputs and outputs in a system having a plurality of nodes.

Clearly, the inventions which we have described by way of example and in illustration of our best mode of practicing the inventions, in the various embodiments described, provide a basis for much potential growth. Accordingly, it will be understood that those skilled in the art, both now and in the future, will envision further improvements even by way of invention, and these should be understood to be within the claimed scope which should be construed to protect and preserve the rights of the inventors.

What is claimed is:

1. A switching network comprising:
    a plurality of bufferless switching apparatuses cascaded into a plurality of stages, said switching apparatuses each including a plurality of switch inputs and a plurality of switch outputs, of the switch outputs included on each of said switching apparatuses each coupled to a different one of the switching apparatuses via a switch input of said different one of the switching apparatuses, switch outputs of last stage switching apparatuses each comprising a network output port and switch inputs of first stage switching apparatuses each comprising a network input port;
    the network output ports each coupled to a network input port through one of a plurality of nodes, each of said nodes comprising means for receiving a data message from a coupled network output port and means for sending a data message to a coupled network input port, said data message to a coupled network input port including a path connection request; and said switching apparatuses each further including:

connection means for establishing a point-to-point communication path between any one of the network input ports and any one of the network output ports in response to said connection request received at said any one of the network input ports, said communication path for transmitting a data message received at said any one of the network input ports to said any one of the network output ports, said connection means including asynchronous connection means for establishing asynchronously a plurality of simultaneously active point-to-point communication paths between a plurality of network input ports and a plurality of network output ports in response to a plurality of connection requests received separately or simultaneously at said plurality of network input ports, said simultaneously active communication paths for transmitting concurrently a plurality of data messages received separately or simultaneously at said plurality of network input ports to said plurality of network output ports.

2. The switching network of claim 1, wherein said switch inputs, switch outputs, and said communication paths each comprise N data lines for transmitting data message bits in parallel over an N bit wide data path comprising said data lines, where N is an integer greater than one.

3. The switching network of claim 2, wherein the path connection request comprises N discrete connection bits sent in parallel over the data lines.

4. The switching network of claim 3, wherein the path connection request includes a dead field, said dead field comprising an N bit wide transmission of logical zeroes.

5. The switching network of claim 4 further comprising means for resolving simultaneous contention between connection requests for use of a switch output, the means for resolving contention including means for logically ORing the data and control lines of switch inputs transmitting the contending connection requests for use of the switch output to determine, during a duration of said dead field, which contending connection request will be granted use of the switch output.

6. The switching network of claim 2, wherein said switch inputs, switch outputs, and said communication paths each further comprise a plurality of control lines, a first of said control lines for sending back to a sending node an acceptance signal for indicating to the sending node a successful transmission of the data message.

7. The switching network of claim 6, wherein said first of said second control lines is used by a switching apparatus or by a receiving node for signalling back to said sending node a rejection of the data message.

8. The switching network of claim 7, wherein said rejection of the data message is triggered by a blocked switch output or by an erroneous transmission of the data message.

9. The switching network of claim 6, wherein a second of said control lines is used by the sending node for terminating by an in-progress transmission of a data message and for signalling an end of any data message.

10. A switching network comprising:

a bufferless switching apparatus comprising a plurality of switch inputs and a plurality of switch outputs;

a plurality of nodes each coupled to one of the switch outputs and to one of the switch inputs, each node comprising means for receiving a data message from a coupled switch output and means for sending a data message to a coupled switch input, the data message to a coupled switch input including a connection request;

said bufferless switching apparatus including connection means for establishing a point-to-point communication path between any one of the switch inputs and any one of the switch outputs in response to said connection request received at said any one of the switch inputs, said communication path for transmitting a data message received at said any one of the switch inputs to said any one of the switch outputs;

said connection means including asynchronous connection means for establishing asynchronously a plurality of simultaneously active point-to-point communication paths between a plurality of switch inputs and a plurality of switch outputs in response to a plurality of connection requests received separately or simultaneously at said plurality of switch inputs, said simultaneously active communication paths for transmitting concurrently a plurality of data messages received separately or simultaneously at said plurality of switch inputs to said plurality of switch outputs.

11. A bufferless and clockless switching apparatus comprising:

a plurality of switch inputs and a plurality of switch outputs;

connection means for establishing a circuit-switched point-to-point communication path between any one of the switch inputs and any one of the switch outputs in response to a connection request received at said any one of the switch inputs, said communication path for transmitting a data message received at said any one of the switch inputs to said any one of the switch outputs;

said connection means including asynchronous connection means for establishing asynchronously a plurality of simultaneously active circuit-switched point-to-point communication paths between a plurality of switch inputs and a plurality of switch outputs in response to a plurality of connection requests received separately or simultaneously at said plurality of switch inputs, said simultaneously active communication paths for transmitting concurrently a plurality of data messages received separately or simultaneously at said plurality of switch inputs to said plurality of switch outputs; and said asynchronous connection means including means for establishing asynchronously said simultaneously active communication paths between all of the switch inputs and all of the switch outputs.

* * * * *